United States Patent [19]

Tomita et al.

[11] Patent Number: 5,384,726
[45] Date of Patent: Jan. 24, 1995

[54] SEMICONDUCTOR MEMORY DEVICE HAVING A CAPABILITY FOR CONTROLLED ACTIVATION OF SENSE AMPLIFIERS

[75] Inventors: Hiroyoshi Tomita; Makoto Yanagisawa; Yukinori Kodama, all of Kawasaki, Japan

[73] Assignee: Fujitsu Limited, Kanagawa, Japan

[21] Appl. No.: 193,535

[22] Filed: Feb. 8, 1994

[30] Foreign Application Priority Data

Mar. 18, 1993 [JP] Japan .................................. 5-059109
Mar. 18, 1993 [JP] Japan .................................. 5-059110

[51] Int. Cl.⁶ .................................. G11C 5/06
[52] U.S. Cl. .................................. 365/63; 365/51; 257/208
[58] Field of Search .................................. 365/63, 51, 72; 257/180, 181, 208, 210

[56] References Cited

U.S. PATENT DOCUMENTS

| | | | |
|---|---|---|---|
| 4,747,078 | 5/1988 | Miyamoto | 365/51 |
| 5,014,241 | 5/1991 | Asakura et al. | 365/51 |
| 5,072,425 | 12/1991 | Kohno et al. | 365/63 X |
| 5,184,321 | 2/1993 | Konishi et al. | 365/51 |
| 5,272,665 | 12/1993 | Uesugi | 365/63 |
| 5,321,646 | 6/1994 | Tomishima et al. | 365/51 |

FOREIGN PATENT DOCUMENTS 3-91189A 4/1991 Japan .

*Primary Examiner*—Eugene R. LaRoche
*Assistant Examiner*—Son Dinh
*Attorney, Agent, or Firm*—Nikaido, Marmelstein, Murray & Oram

[57] ABSTRACT

A semiconductor memory device includes a memory cell array in which a number of sense amplifiers are provided, a plurality of segmented drive lines each connected to a group of sense amplifiers for driving the same, each of the segmented drive lines being formed of first and second drive line segments forming a pair, and a number of trunks for supplying electric power to the segmented drive lines. Each of the trunks includes a first conductor strip extending from a first side of the memory cell array toward a second side for connection to a plurality of the first drive line segments upon crossing the same, and a second conductor strip extending from the second side of the memory cell array toward the first side for connection to a plurality of the second drive line segments upon crossing the same. The first and second conductor strips have distal end parts having a reduced width and a mutually complementary shape, such that the first and second conductor strips are disposed to form a straight strip having a substantially constant width throughout the memory cell array.

7 Claims, 21 Drawing Sheets

166

166

170

170

162 (167)

SEMICONDUCTOR MEMORY DEVICE HAVING A CAPABILITY FOR CONTROLLED ACTIVATION OF SENSE AMPLIFIERS

BACKGROUND OF THE INVENTION

The present invention generally relates to semiconductor memory devices and more particularly to a semiconductor memory device that has a capability for controlled activation of sense amplifiers. More particularly, the present invention relates to a semiconductor memory device such as a random access memory (DRAM) having a construction for selective activation of sense amplifiers. However, the present invention is by no means limited to DRAMs but is applicable also to static random access memories (SRAMs) or flash memories.

FIG. 1 shows the schematical construction of a typical DRAM having a storage capacity of 64 Mbits in a plan view.

Referring to FIG. 1, the memory device includes a chip body 1 that carries thereon a plurality of row decoders 2–5 for decoding row address data, a plurality of memory cell arrays 6–13 each having a storage capacity of 8 Mbits, and a plurality of driver arrays 14–21 for activating sense amplifiers by producing drive signals.

FIG. 2 shows schematically the construction of the memory cell arrays 6 and 7, wherein the hexadecimal numbers attached to the reference numerals indicate the location of the element designated by the reference numeral in the memory cell array.

Referring to FIG. 2, each memory cell array includes a number of memory cell blocks $22A_0$–$22A_F$, $22B_0$–$22B_F$, $23A_0$–$23A_F$ and $23B_0$–$23B_F$, each having a size of 256 kbits and including therein memory cells arranged in 256 rows and 1024 columns. In addition, the memory cell array includes rows of sense amplifiers $24_0$–$24_F$ and $25_0$–$25_F$.

FIG. 3 shows a part of the memory cell array 6, wherein the elements shown in FIG. 3 include hexadecimal indices indicative of the location of the element in the memory cell array 6.

Referring to FIG. 3, the memory cell array 6 includes memory cell segments $26_{000}$–$26_{0FF}$ and $26_{100}$–$26_{1FF}$ each having a predetermined size, and there are provided a number of drive lines $27_{00}$–$27_{0F}$ and $27_{10}$–$27_{1F}$ $26_{1FF}$ extending vertically in FIG. 3 for carrying a drive signal NSA that is supplied to n-MOS transistors forming the sense amplifiers. Similarly, there are provided a number of drive lines $28_{00}$–$28_{0F}$ and $28_{10}$–$28_{1F}$ for carrying a drive signal PSA to be supplied to p-MOS transistors that form the sense amplifiers together with the p-MOS transistors.

In addition, the construction of FIG. 3 includes drivers $29_{00}$–$29_{0F}$ for producing drive signals $NSA_{00}$, $PSA_{00}$, ... $NSA_{0F}$ and $PSA_{0F}$ for driving a first group of the sense amplifiers located in the upper-half part of the memory cell array 6, as well as other drivers $29_{10}$–$29_{1F}$ that produce drive signals $NSA_{10}$, $PSA_{10}$, ... $NSA_{1F}$ and $PSA_{1F}$ for driving the other group of the sense amplifiers located in the lower-half part of the memory cell array 6.

The drive signals $NSA_{00}$–$NSA_{0F}$ are supplied to the drive lines $27_{00}$–$27_{0F}$ via trunks $30_{00}$–$30_{0F}$, while the drive signals $NSA_{10}$–$NSA_{1F}$ are supplied to the drive lines $27_{10}$–$27_{1F}$ via trunks $30_{10}$–$30_{1F}$.

Similarly, there are provided trunks $31_{00}$–$31_{0F}$ for supplying the drive signals $PSA_{00}$–$PSA_{0F}$ to the drive lines $28_{00}$–$28_{0F}$ and trunks $31_{10}$–$31_{1F}$ for supplying the drive signals $PSA_{10}$–$PSA_{1F}$ to the drive lines $28_{10}$–$28_{1F}$.

It should be noted that the trunks $30_{00}$–$30_{0F}$, $30_{10}$–$30_{1F}$, $31_{00}$–$31_{0F}$ and $31_{10}$–$31_{1F}$ are provided at an upper level of the drive lines $27_{00}$–$27_{0F}$, $27_{10}$–$27_{1F}$, $28_{00}$–$28_{0F}$ and $28_{10}$–$28_{1F}$ on the chip 1.

FIG. 4 shows a circuit diagram of the DRAM of FIG. 1 corresponding to the part of the memory cell segment $26_{000}$ and the driver $29_{00}$, wherein it will be noted that there are provided word lines $WL_0$... $WL_n$, and $WL_{n+1}$... $WL_{2n}$ in correspondence to the memory cell segment $26_{000}$ for selecting a memory cell. Similarly, there are provided complementary bit pairs $BL_0$, $/BL_0$, ... $BL_m$ and $/BL_m$ for carrying out read/write operation of data to and from the selected memory cell.

In FIG. 4, there are provided a number of memory cells $32_{00}$... $32_{0m}$, $32_{n0}$... $32_{nm}$, $32_{(n+1)0}$... $32_{(n+1)m}$, and $32_{(2n)0}$... $32_{(2n)m}$ disposed in a row and column formation, wherein the memory cells are selected by selection circuits 33 and 34. Further, there are provided sense amplifiers $35_0$ and $35_m$ for amplifying the information read out from the selected memory cell.

In order to select a bit line pair, column gates $36_0$... $36_m$ are provided, and data buses DB and /DB, provided commonly to the bit line pairs $BL_0$, $/BL_0$, ... $BL_m$ and $/BL_m$, are selected in response to control signals $CL_0$... $CL_m$ that activates the corresponding column gates $36_0$... $36_m$.

The sense amplifier such as the amplifier $29_{00}$ includes p-MOS transistors 38 and 39 as well as n-MOS transistors 40 and 41. The sense amplifier is thereby supplied with a precharge voltage VPR (VPR=½ Vcc) and is controlled in response to complementary activation signals $\phi$ and $/\phi$ as well as complementary reset signals R and /R.

When reading data, a memory cell block is selected from the cell array groups 6–9 and 10–13 shown in FIG. 1. For example, when data is to be read out from the cell array group formed of the memory cell arrays 6–9, a memory cell block such as the blocks $22A_k$, $22A_{k+1}$, 23A or $23A_{k+1}$ or a block such as $22B_k$, $22B_{k+1}$, 23B and $23B_{k+1}$ is selected, wherein k is an even integer.

In this example, therefore, drive signals $NSA_{0k}$ and $PSA_{0k}$ are supplied from a driver $29_{0k}$ via drive lines $27_{0k}$ and $28_{0k}$ respectively. Similarly, drive signals $NSA_{0(k+1)}$ and $PSA_{0(k+1)}$ are supplied from a driver $29_{0(k+1)}$ via drive lines $27_{0(k+1)}$ and $28_{0(k+1)}$ respectively. Similarly, drive signals $NSA_{1k}$ and $PSA_{1k}$ are supplied from a driver $29_{1k}$ via drive lines $27_{1k}$ and $28_{1k}$ respectively, drive signals $NSA_{1(k+1)}$ and $PSA_{1(k+1)}$ are supplied from a driver $29_{1(k+1)}$ via drive lines $27_{1(k+1)}$ and $28_{1(k+1)}$ respectively.

In DRAM or semiconductor memory devices in general, it is necessary to drive the entire sense amplifiers substantially at the same drive voltage in order to secure a reliable reading operation. In order to achieve this, it is necessary to suppress the parasitic resistance of the drive lines of the sense amplifiers as small as possible.

On the other hand, recent semiconductor memory devices having a miniaturized device pattern uses a correspondingly miniaturized conductor pattern for the drive lines 27 or 28 of the sense amplifiers. Thereby, it has been difficult to supply a sufficient drive current to the sense amplifiers, and there has been a problem in the reliable reading operation of the semiconductor memory device.

As a solution to the foregoing problem, the DRAM of FIG. 1 employs a construction wherein a memory cell array such as the memory cell array 6 is divided into two regions, one including a memory cell segment $26_{000}$-$26_{0FF}$ and the other including a memory cell segment $26_{100}$-$26_{1FF}$, both of the memory cell segments being arranged in a 16×16 formation, such that the drive lines 27 and 28 are divided into two line segments, such as a segment $27_{00}$ and a segment $27_{10}$ or a segment $28_{00}$ and a segment $28_{10}$. Thereby, the length of the drive lines is decreased by one-half and the effect of the parasitic resistance of the drive lines is reduced.

Even with the foregoing construction, however, the reduction of the parasitic resistance of the drive lines is not satisfactory. Thus, there is a desire to divide the memory cell array into eight regions to reduce the parasitic resistance further.

In order to realize such a construction wherein the number of trunks is increased, however, it is necessary to secure a sufficient width for the individual conductor patterns of the trunks $30_{00}$-$30_{0F}$, $30_{10}$-$30_{1F}$, $31_{00}$-$31_{0F}$ and $31_{10}$-$31_{1F}$ such that a sufficient drive current is supplied to the sense amplifiers. However, such an increased width of the conductor patterns contradicts with the requirement of increased number of the trunks, and because of this reason, it has been conventionally difficult to divide the drive lines 27 or 28 into eight segments. The foregoing problem of increase of the parasitic resistance becomes a major problem in the memory devices having a storage capacity exceeding 64 Mbits such as a DRAM having a 256 Mbit capacity.

In the DRAM or other semiconductor memory devices having such a segmented construction of the memory cell array as shown in FIG. 3, it should be noted that one has to selectively activate the drivers $29_{00}$-$29_{0F}$ and $29_{10}$-$29_{1F}$. As such a selective activation requires supplying of various control signals to each of the drivers, the area of the chip that is occupied by the conductor patter for carrying such control signals increases substantially, particularly when the number of the drive line segments is increased for reducing the parasitic resistance of the drive lines. Thereby, there arises a problem that the area that is used for the memory cell array is decreased.

SUMMARY OF THE INVENTION

Accordingly, it is a general object of the present invention to provide a novel and useful semiconductor memory device wherein the foregoing problems are eliminated.

Another and more specific object of the present invention is to provide a semiconductor memory device having a construction wherein the parasitic resistance of drive lines used for driving sense amplifiers aligned in a row is minimized even when the semiconductor memory device has a large storage capacity exceeding 256 Mbits, by dividing the drive lines into a plurality of line segments.

Another object of the present invention is to provide a semiconductor memory device, comprising:

a memory cell array provided on a semiconductor chip and including a plurality of memory cells aligned in rows and columns, each of said memory cells storing therein information, said memory cell array being defined by a boundary including first and second, mutually opposing edges each extending in a column direction;

a plurality of sense amplifier columns provided on said memory cell array, each of said plurality of sense amplifier columns including a plurality of sense amplifiers aligned in said column direction;

a plurality of drive line pairs provided on said memory cell array in correspondence to said plurality of sense amplifier columns, each of said drive line pairs including first and second drive lines extending in said column direction, each of said drive line pairs supplying an electric power to a plurality of sense amplifiers included in a corresponding sense amplifier column;

a first driver circuit provided on said semiconductor chip at a location outside said memory cell array for producing a first drive current;

a second driver circuit provided on said semiconductor chip at a location outside said memory cell array for producing a second drive current;

a first trunk pattern extending from said first driver for carrying said first drive current, said first trunk pattern extending in a row direction over said memory cell array from said first edge toward said second edge across a plurality of sense amplifier columns and connected to first drive lines in said plurality of drive line pairs corresponding to said plurality of sense amplifier columns that said first trunk pattern has crossed;

a second trunk pattern extending from said second driver for carrying said second drive current, said second trunk pattern extending in a row direction over said memory cell array from said second edge toward said first edge across a plurality of sense amplifier columns and connected to second drive lines in said plurality of drive line pairs corresponding to said plurality of sense amplifier columns that said second trunk pattern has crossed;

said first trunk pattern having a width that decreases from said first edge of said memory cell array toward said second edge, such that said first trunk has a first width at said first edge and a second, smaller width at a free end of said first trunk pattern;

said second trunk pattern having a width that decreases from said second edge of said memory cell array toward said first edge, such that said second trunk has a width substantially equal to said first width at said second edge and a smaller width substantially equal to said second width at a free end of said second trunk pattern;

said first and second trunk patterns being so disposed that said first and second trunk patterns extend over said memory cell array in correspondence to a hypothetical strip-like area extending from said first edge to said second edge of said memory cell array with a constant width substantially equal to said first width.

According to the present invention, one can provide increased number of trunk patterns on the memory cell array because of the reduced width and hence the area of the strip-like region that is occupied by the trunk patterns. In other words, one can provide twice as large number of the trunk patterns in the column direction as compared with the conventional structure of FIG. 3. Thereby, the drive lines for supplying the driving power to the sense amplifiers can be segmented further, and the parasitic resistance of the drive lines is decreased accordingly.

Another object of the present invention is to provide a semiconductor memory device, comprising:

a plurality of memory cell areas forming a memory cell array, each of said memory cell areas including a plurality of memory cells for storing information and sense amplifiers for detecting the content of information stored in said memory cells;

a plurality of drive circuits provided in correspondence to said plurality of memory cell areas, each of said drive circuits being supplied with a control signal for activating the sense amplifiers included in a corresponding memory cell area;

a plurality of gate circuits provided in correspondence to said plurality of drive circuits, each of said gate circuits being supplied with said control signal for controlling a passage of said control signal to a corresponding drive circuit;

control circuit means for producing said control signal and for supplying said control signal commonly to said plurality of drive circuits, and selection circuit means connected to each of said plurality of gate circuits for selecting one of said gate circuits as a selected gate circuit, such that said selected gate circuit passes said control signal to a corresponding drive circuit.

According to the present invention, one can simplify the selection of the gate circuit and hence the drive circuit of the sense amplifier in correspondence to the selection of the memory cell area in the memory cell array. One can use the same line commonly for supplying the control signal to the plurality of gate circuits while the selection of the gate circuit is achieved based upon a separate address signal that is supplied from the selection circuit to the individual gate circuits. In view of the fact that a plurality of control signals are used for controlling a single gate circuit, the foregoing construction of using the same common line for supplying the control signal to the gate circuits, reduces substantially the area occupied by the wiring pattern for such a line. The construction of the present invention is particularly effective in large capacity DRAMs exceeding the storage capacity of 64 Mbits.

Other objects and further features of the present invention will become apparent from the following detailed description when read in conjunction with the attached drawings.

DETAILED DESCRIPTION OF PREFERRED EMBODIMENTS

Figure 5:
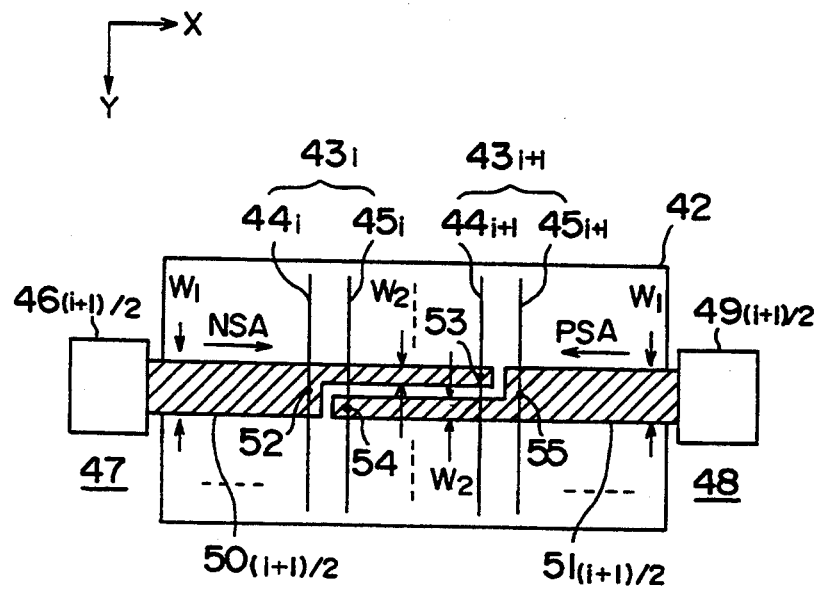
FIG. 5 is a diagram showing the principle of the present invention.

FIG. 5 shows the principle of a first embodiment of the present invention. It should be noted that the present invention provides an improvement of a DRAM having a memory cell array 42 in which sense amplifiers are aligned in Y-direction to form a sense amplifier column. In correspondence to the sense amplifier column, there are provided a pair of drive lines $44_i$ and $45_i$ or $44_{i+1}$ and $45_{i+1}$ extending in the Y-direction respectively for carrying a first drive signal NSA and a second drive signal PSA. Thereby, the lines $44_i$ and $45_i$ form a line pair $43_i$, the lines $44_{i+1}$ and $45_{i+1}$ form a line pair $43_{i+1}$. In the foregoing representation, the suffix i is an integer equal to or larger than one.

In the DRAM of the present invention, a sense amplifier driver $46_{(i+1)/2}$ and a sense amplifier driver $49_{(i+1)/2}$ are disposed at both opposing edges of the memory cell array 42, wherein the driver $46_{(i+1)/2}$ produces the drive signal NSA while the driver $49_{(i+1)/2}$ produces the drive signal PSA. Further, it will be noted that a trunk $50_{(i+1)/2}$ and a trunk $51_{(i+1)/2}$ extend in the X-direction respectively from the driver $46_{(i+1)/2}$ and the driver $49_{(i+1)/2}$ so as to approach with each other. The trunk $50_{(i+1)/2}$ thereby carries the drive signal NSA to the drive lines $44_i$ and $44_{i+1}$, while the trunk $51_{(i+1)/2}$ carries the drive signal PSA to the drive lines $45_i$ and $45_{i+1}$. It should be noted that trunk $50_{(i+1)/2}$ is connected to the drive lines $44_i$ and $44_{i+1}$ at contact holes 52 and 53 respectively, while the trunk $51_{(i+1)/2}$ is connected to the drive lined $45_i$ and $45_{i+1}$ at contact holes 54 and 55.

Figure 3:
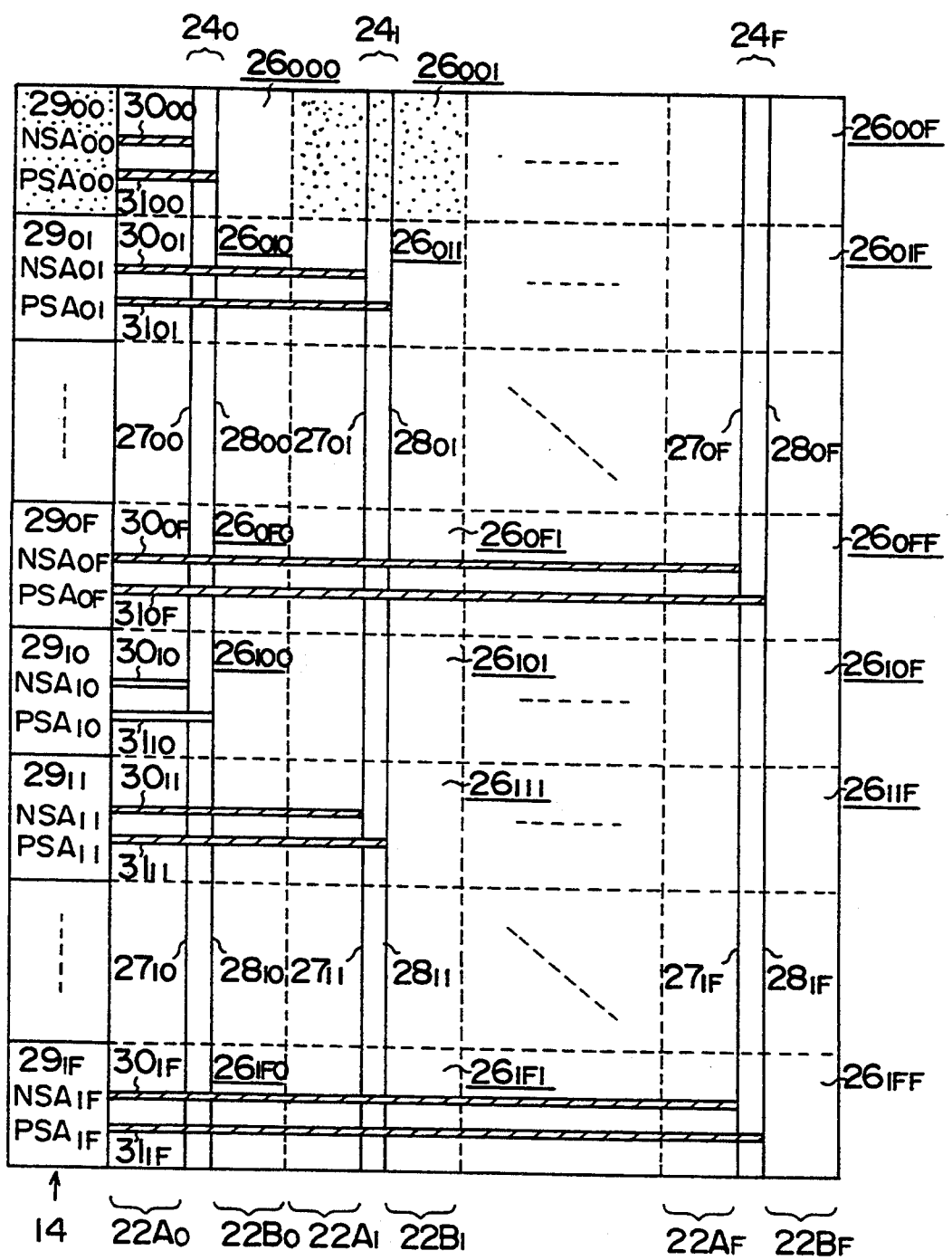
FIG. 3 is a diagram showing the layout of the memory cell array of FIG. 2.

In the construction of FIG. 5, it should be noted that the trunks $50_{(i+1)/2}$ and $51_{(i+1)/2}$ are aligned straight on a hypothetical strip-like region extending in the X-direction over the memory cell array 42, wherein such a strip-like region has a width corresponding to the width $W_1$ of the conductor strip forming the trunks $50_{(i+1)/2}$ and $51_{(i+1)/2}$. It should be noted that each of the conductor strip has a finger-like distal end part extending beyond the contact hole 52 or 55, with a reduced width $W_2$, and two such distal end parts extend parallel with each other in the foregoing strip-like region side by side. Thereby, one can dispose more trunks on the memory cell array 42 as compared with the conventional construction of FIG. 3. As a result of increased number of the trunks, one can divide the drive lines into shorter segments, and associated with this, the parasitic resistance of the drive lines is minimized. It should be noted that the drive current supplied to the drive lines does not experience decrease as a result of such a construction.

Figure 6:
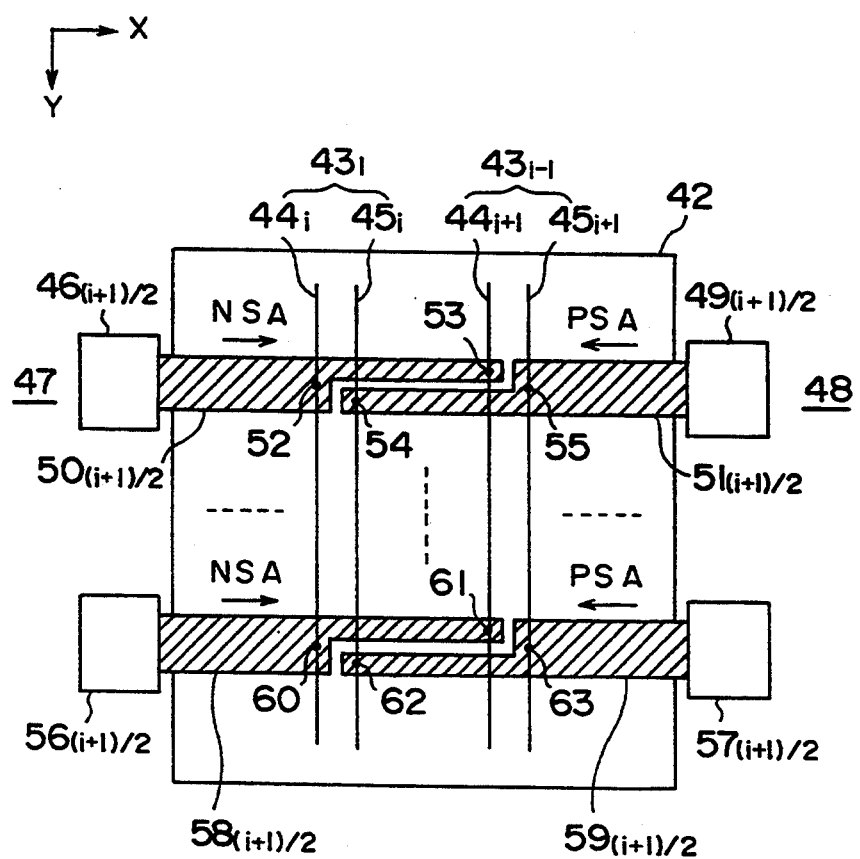
FIG. 6 is another diagram showing the principle of the present invention.

FIG. 6 shows another principal construction of the present invention, wherein drivers $56_{(i+1)/2}$ and $57_{(i+1)/2}$ are disposed at the opposing side edges of the memory cell array 42 in addition to the foregoing drivers $46_{(i+1)/2}$ and $49_{(i+1)/2}$. Further, trunks $58_{(i+1)/2}$ and $59_{(i+1)/2}$ extend respectively from the drivers $46_{(i+1)/2}$ and $49_{(i+1)/2}$ in the X-direction so as to approach with each other. By providing additional trunks $58_{(i+1)/2}$ and $59_{(i+1)/2}$, one can minimize the voltage drop in the drive lines $44_i$, $44_{i+1}$, $45_i$ and $45_{i+1}$.

In FIG. 6, it should be noted that the trunk $58_{(i+1)/2}$ is connected to the drive line $44_i$ at a contact hole 60 and to the drive line $44_{i+1}$ at a contact hole 61. Similarly, the trunk $59_{(i+1)/2}$ is connected to the drive line $45_i$ at a contact hole 62 and to the drive line $45_{i+1}$ at a contact hole 63. Again, one obtains an advantageous feature of reduced area occupied by the conductor patterns forming the trunks.

Figure 1:
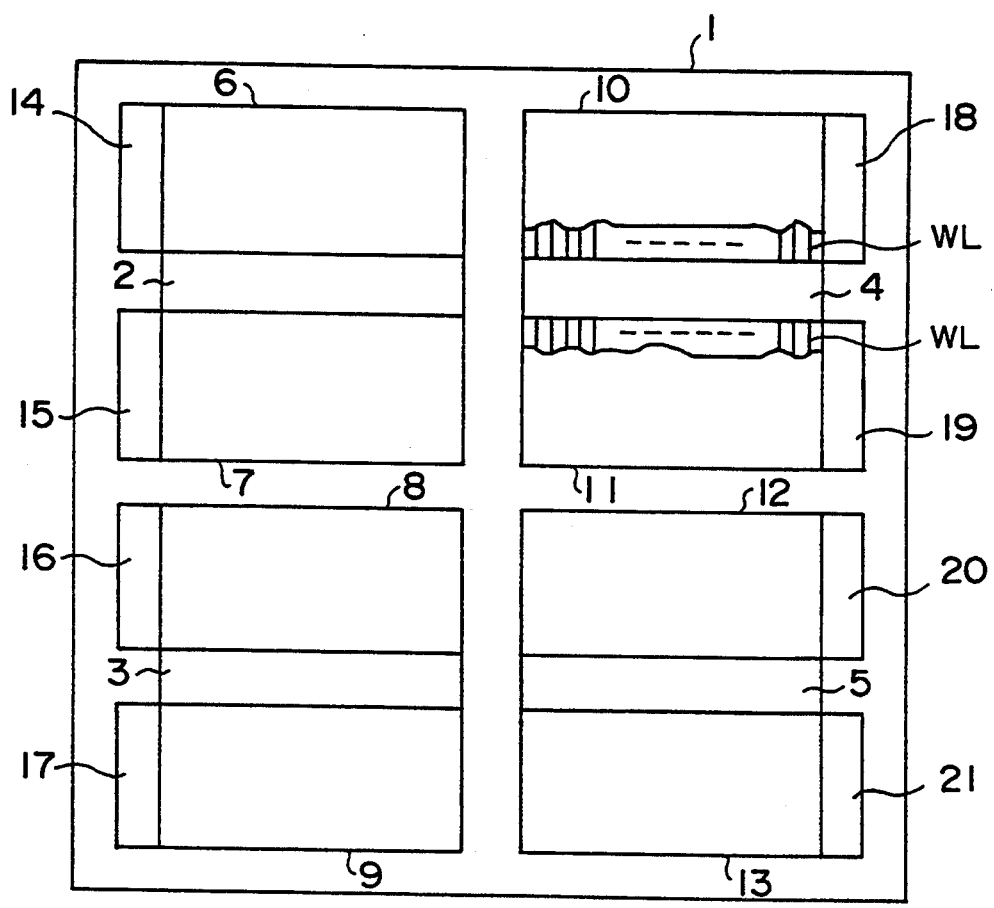
FIG. 1 is a diagram showing the construction of a conventional DRAM.
Figure 2:
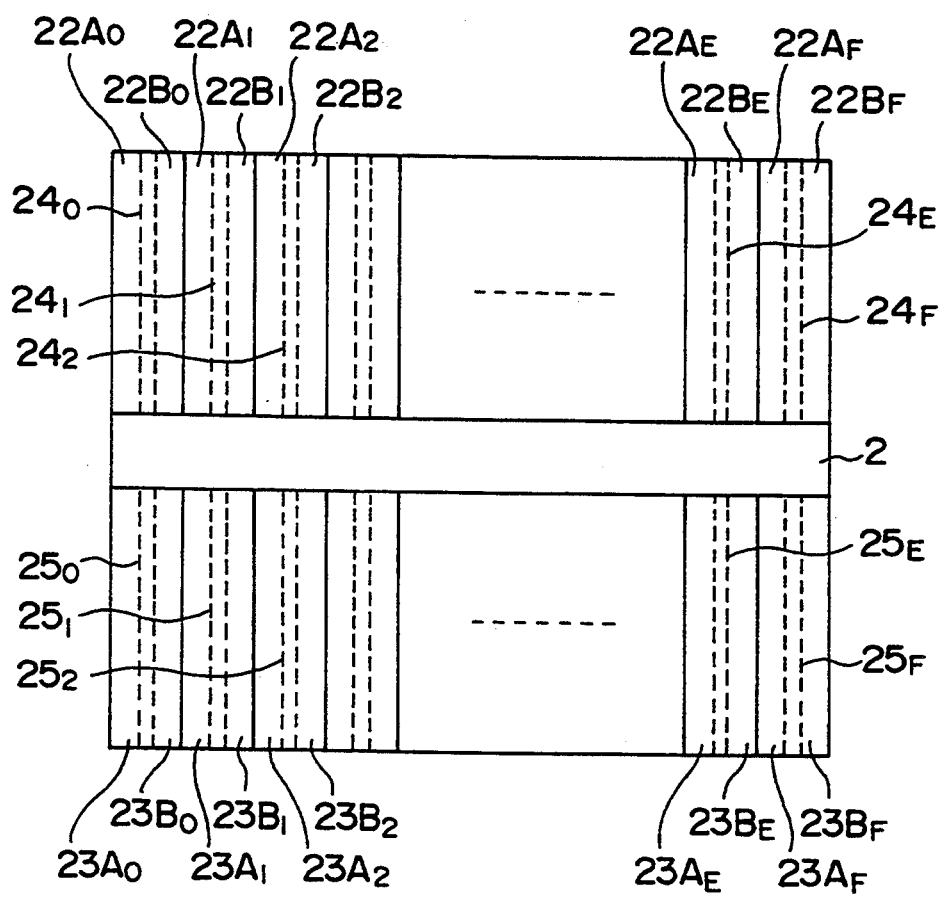
FIG. 2 is a diagram showing a part of the memory cell array of FIG. 1 in an enlarged scale.

Next, the first embodiment of the present invention will be described with reference to FIGS. 7–8, wherein the embodiment corresponds to an improvement of the 64 Mbit DRAM shown in FIG. 1.

Figure 7:
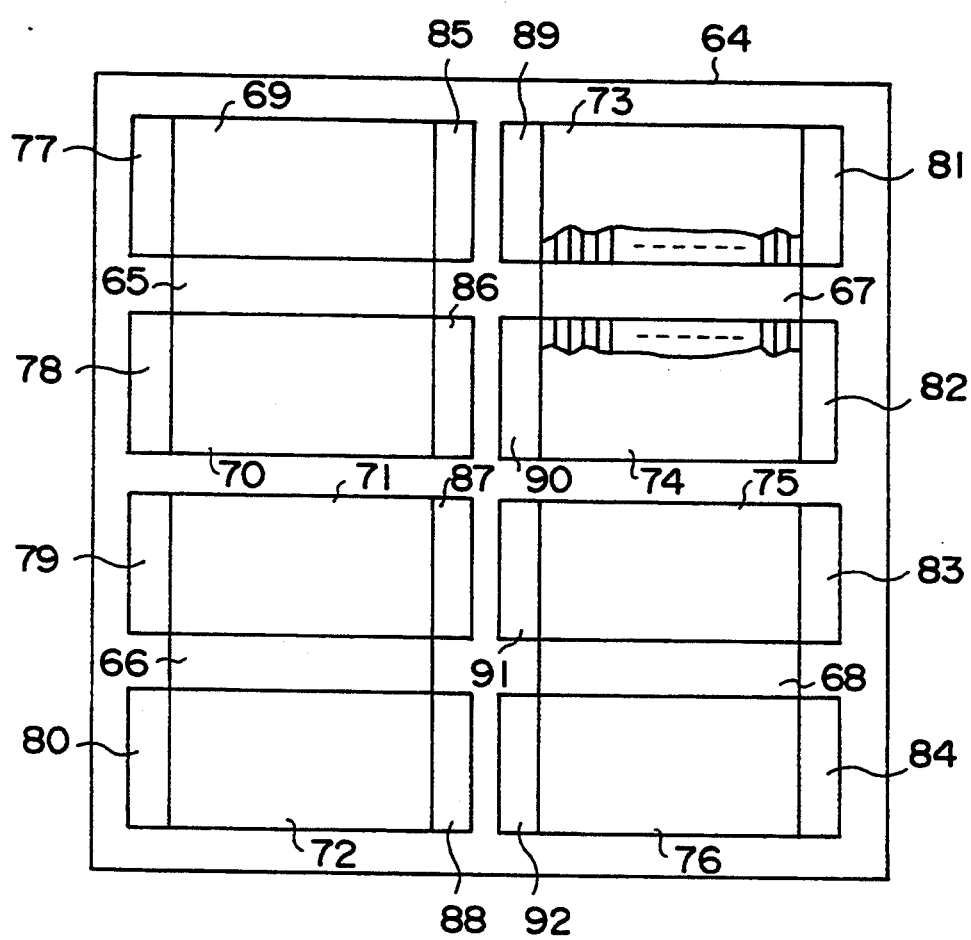
FIG. 7 is a diagram showing a DRAM according to a first embodiment of the present invention.

Referring to FIG. 7 showing the present embodiment in a plan view, the DRAM includes a chip 64 on which the memory device is constructed. On the chip 64, there are provided a plurality of memory cell arrays 69–76 each having a storage capacity of 8 Mbits, and a number of row decoders 65–68 are provided on the chip 64 in correspondence to the memory cell arrays 69–76.

In correspondence to the plurality of the memory cell arrays 69–76, there are provided a plurality of driver blocks 77–84 and 85–92 each including a plurality of drivers aligned in a row for producing a drive signal NSA or PSA for activating sense amplifiers.

Figure 8:
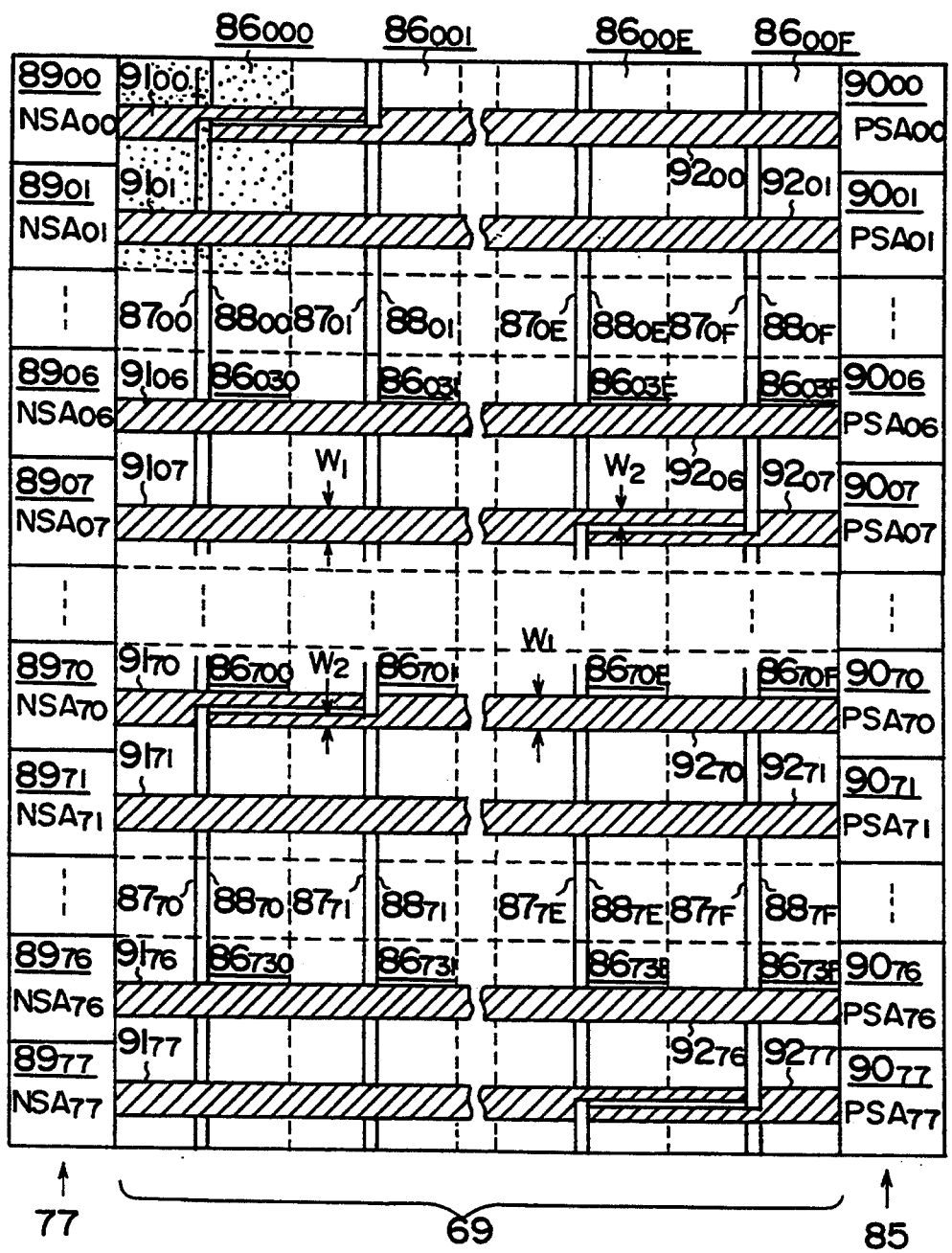
FIG. 8 is a diagram showing the layout of the memory cell array used in the DRAM of FIG. 7.

FIG. 8 shows the construction of the memory cell array 69 in FIG. 7 as well as the construction of the driver units 77 and 85 that cooperate with the memory cell array 69. As shown in FIG. 8, the memory cell array 69 is divided into a plurality of memory cell segments $86_{000}$–$86_{00F}$, $86_{030}$–$86_{03F}$, $86_{700}$–$86_{70F}$ and $86_{730}$–$86_{73F}$, wherein the memory cell segments are arranged in 32 rows and 16 columns. In FIG. 8, too, the hexadecimal indices attached to the numerals indicate the location of the memory cell segment in the memory cell array 69 similarly to FIG. 3.

In FIG. 8, it should be noted that there are provided drive lines $87_{00}$–$87_{0F}$ and $87_{70}$–$87_{7F}$ for carrying the drive signals NSA, and drive lines $88_{00}$–$88_{0F}$ and $88_{70}$–$88_{7F}$ are provided for carrying the drive signals PSA. Further, there are provided drivers $89_{00}$–$89_{07}$ and $89_{70}$–$89_{77}$ for producing the drive signals $NSA_{00}$–$NSA_{07}$ and $NSA_{70}$–$NSA_{77}$ respectively. Similarly, there are provided drivers $90_{00}$–$90_{07}$ and $90_{70}$–$90_{77}$ for producing the drive signals $PSA_{00}$–$PSA_{07}$ and $PSA_{70}$–$PSA_{77}$ respectively.

In addition, the construction of FIG. 8 includes trunks $91_{00}$–$91_{07}$ provided for supplying the drive signals $NSA_{00}$–$NSA_{07}$ to the drive lines $87_{00}$–$87_{0F}$ respectively. Similarly, there are provided trunks $91_{70}$–$91_{77}$ for supplying the drive signals $NSA_{70}$–$NSA_{77}$ to the drive lines $87_{70}$–$87_{7F}$ respectively. Similarly, trunks $92_{00}$–$92_{07}$ are provided for supplying the drive signals $PSA_{00}$–$PSA_{07}$ to the drive lines $88_{00}$–$88_{0F}$ respectively, and trunks $92_{70}$–$92_{77}$ are provided for supplying the drive signals $PSA_{70}$–$PSA_{77}$ to the drive lines $88_{70}$–$88_{7F}$ respectively.

In the structure of FIG. 8, it should be noted that the trunks $91_{00}$–$91_{07}$, $91_{70}$–$91_{77}$, $92_{00}$–$92_{07}$ and $92_{71}$–$92_{77}$ extend over the chip 64 at a level above the level of the drive lines $87_{00}$–$87_{0F}$, $87_{70}$–$87_{7F}$, $88_{00}$–$88_{0F}$ and $88_{70}$–$88_{7F}$. Further, it should be noted that the drivers $89_{00}$–$89_{07}$ and $89_{70}$–$89_{77}$ are disposed at one side of the memory cell array 69, while the drivers $90_{00}$–$90_{07}$ and $90_{70}$–$90_{77}$ are disposed at the other side of the memory cell array 69.

In the structure of FIG. 8, it should be noted that the width of the trunks $91_{00}$–$91_{07}$ and $91_{70}$–$91_{77}$ decreases stepwise from a first width $W_1$ at the left edge of the memory cell array 69 to a second width $W_2$ upon crossing of the drive line to which the trunk is connected via the contact hole. Thereby, the trunk extends further to the right with the foregoing second width $W_2$. Similarly, the width of the trunks $92_{00}$–$92_{07}$ and $92_{71}$–$92_{77}$ decreases stepwise from the foregoing first width $W_1$ at the right edge of the memory cell array 69 to the second width $W_2$ upon crossing of the drive line to which the trunk is connected via the contact hole. Thereby, the trunk extends further to the left with the foregoing second width $W_2$. See also the simplified construction of FIG. 5 or FIG. 6. In FIG. 5, for example, the width of the trunk $50_{(i+1)/2}$ decreases stepwise from $W_1$ to $W_2$ upon crossing of the drive line $44_i$ to which the trunk $50_{(i+1)/2}$ is connected via the contact hole 52. The distal part of the trunk $50_{(i+1)/2}$ having the width $W_2$ extends further to the right and connected to the drive line $44_{i+1}$ at the contact hole 53. Similarly, the width of the trunk $51_{(i+1)/2}$ decreases stepwise from $W_1$ to $W_2$ upon crossing of the drive line $45_{i+1}$ to which the trunk $51_{(i+1)/2}$ is connected via the contact hole 55. The distal part of the trunk $51_{(i+1)/2}$ having the width $W_2$ extends further to the left and connected to the drive line $45_{i+1}$ at the contact hole 54.

In the foregoing construction, the trunks extending from the left and from the right have a mutually complementary shape at the distal end parts thereof, such that the two opposing trunks are aligned substantially on a hypothetical, strip-like straight region extending over the memory cell array 42 of FIG. 5 or 69 of FIG. 8 with the foregoing predetermined, constant width $W_1$. Thereby, the area of the memory cell array that is occupied by the trunks is minimized and one can increase the number of such trunks on the memory cell array such that the trunks are provided with a reduced pitch in the Y direction defined in FIG. 5 or FIG. 6. Associated with such an increased number of trunks, one can divide the drive lines into increased number of drive line segments for minimizing the effect of parasitic resistance associated with long drive lines. Further, it should be noted that the structure of the trunks in which the width of the trunks decreases upon every node at which a connection to the drive line is made, ensures supplying of sufficient electric power to the drive line that is connected at the very distal end of the trunk.

Figure 4:
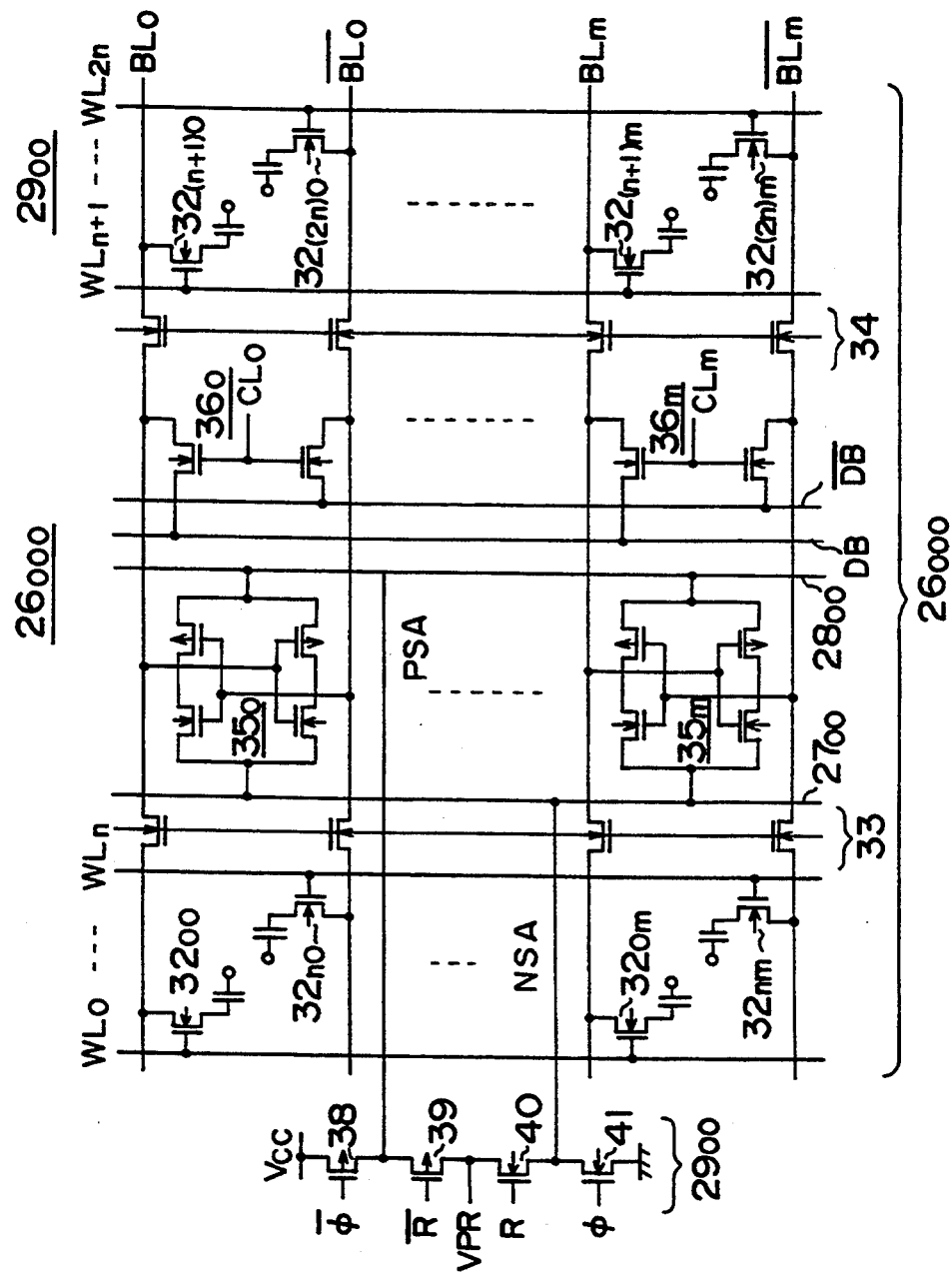
FIG. 4 is a circuit diagram showing the construction of a conventional memory cell array including sense amplifiers.
Figure 9:
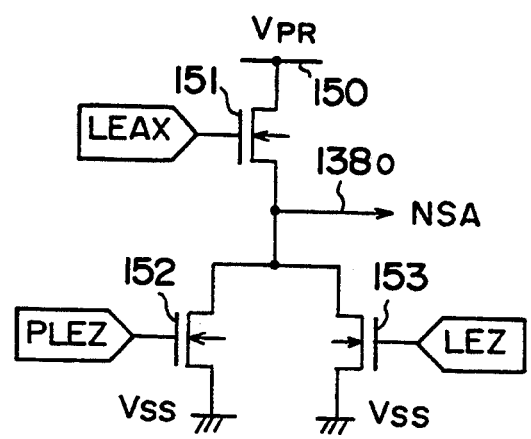
FIGS. 9 and 10 are circuit diagrams showing the construction of driver circuits used in the DRAM of FIG. 7.

FIG. 9 shows an embodiment of the driver used in the construction of FIG. 5 or FIG. 6 for producing the drive signal NSA. In the construction of FIG. 8, the driver of FIG. 9 corresponds to the drivers $89_{00}$–$89_{07}$ and $89_{70}$–$89_{77}$. Further, it should be noted that the circuit of FIG. 9 is a modification of the drive circuit $29_{00}$ of FIG. 4.

Referring to FIG. 9, the driver includes n-MOS transistors 151–153, wherein the transistor 151 has a source connected to a node 150 to which the precharge voltage VPR is supplied. Thereby, the transistor 151 is turned on in response to an enable signal LEAX. The transistors 152 and 153, on the other hand, are connected parallel with each other between the drain of the transistor 151 and a ground terminal Vss, wherein the transistor 152 is turned on in response to a preactivation signal PLEZ for achieving a preliminary activation of the drive lines 44, while the transistor 153 is turned on in response to an activation signal LEZ for achieving a real activation of the drive lines 44. Thereby, the drive signal NSA is obtained at the drain of the transistor 151. As noted already, a voltage of Vcc/2 is supplied to the node 150 as the precharge voltage VPR.

Figure 10:
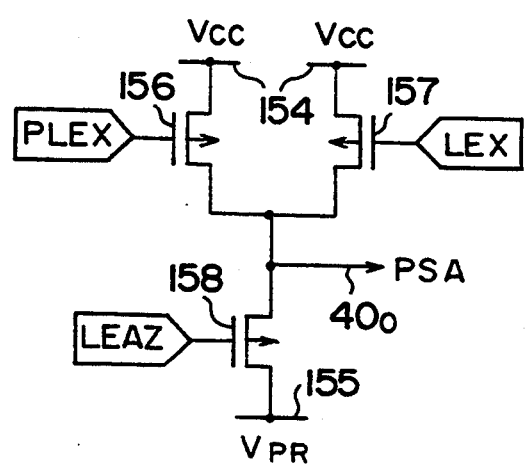

FIG. 10 shows an embodiment of the driver used in the construction of FIG. 5 or FIG. 6 for producing the drive signal PSA. In the construction of FIG. 8, the driver of FIG. 10 corresponds to the drivers $89_{00}$–$89_{07}$ and $90_{70}$–$90_{77}$. It will be noted that the circuit of FIG. 10 is analogous to the circuit of FIG. 9 and includes p-MOS transistors 156–158, wherein the transistor 158 has a source connected to a node 155 to which the precharge voltage VPR is supplied. Thereby, the transistor 158 is turned on in response to a reset signal LEAZ. The transistors 156 and 157, on the other hand, are connected parallel with each other between the drain of the transistor 158 and a supply voltage terminal Vcc, wherein the transistor 156 is turned on in response to a preactivation signal PLEX for achieving a preliminary activation of the drive lines 45, while the transistor 157 is turned on in response to an activation signal LEX for achieving a real activation of the drive lines 45. Thereby, the drive signal PSA is obtained at the drain of the transistor 158. As noted already, a voltage of Vcc/2 is supplied to the node 155 as the precharge voltage VPR.

Figure 11:
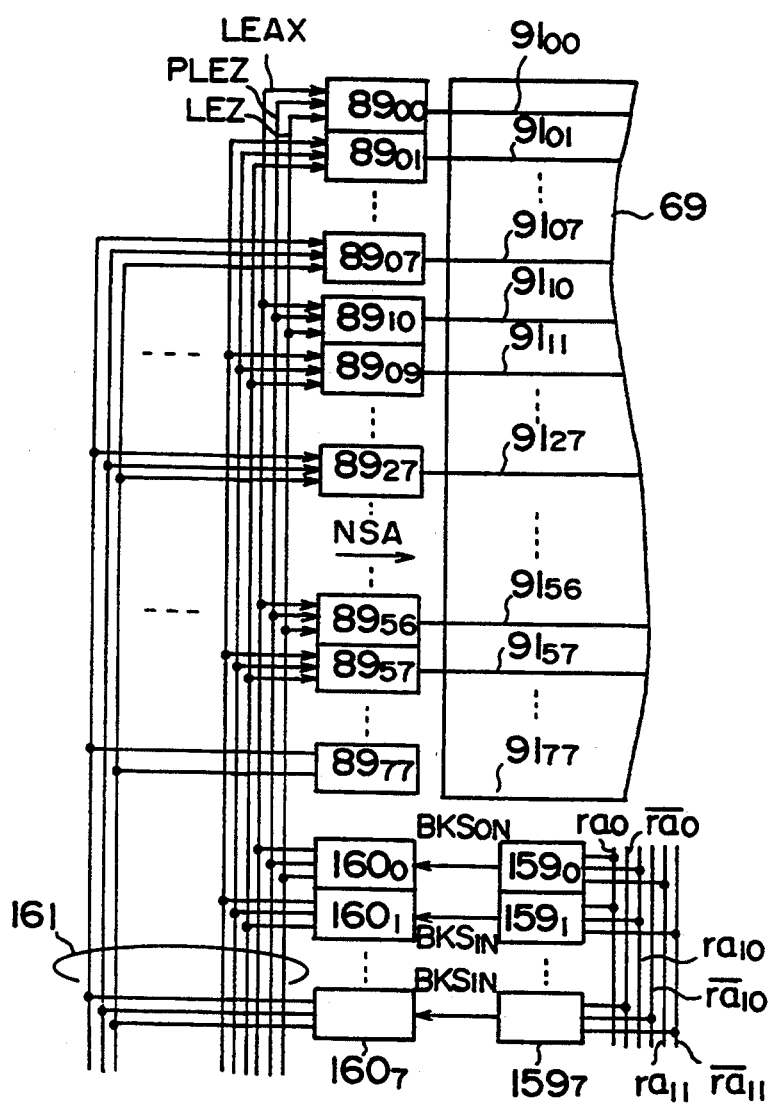
FIGS. 11 and 12 are diagrams showing the interconnection for selectively activating the sense amplifiers in the DRAM of the first embodiment of the present invention.
Figure 12:
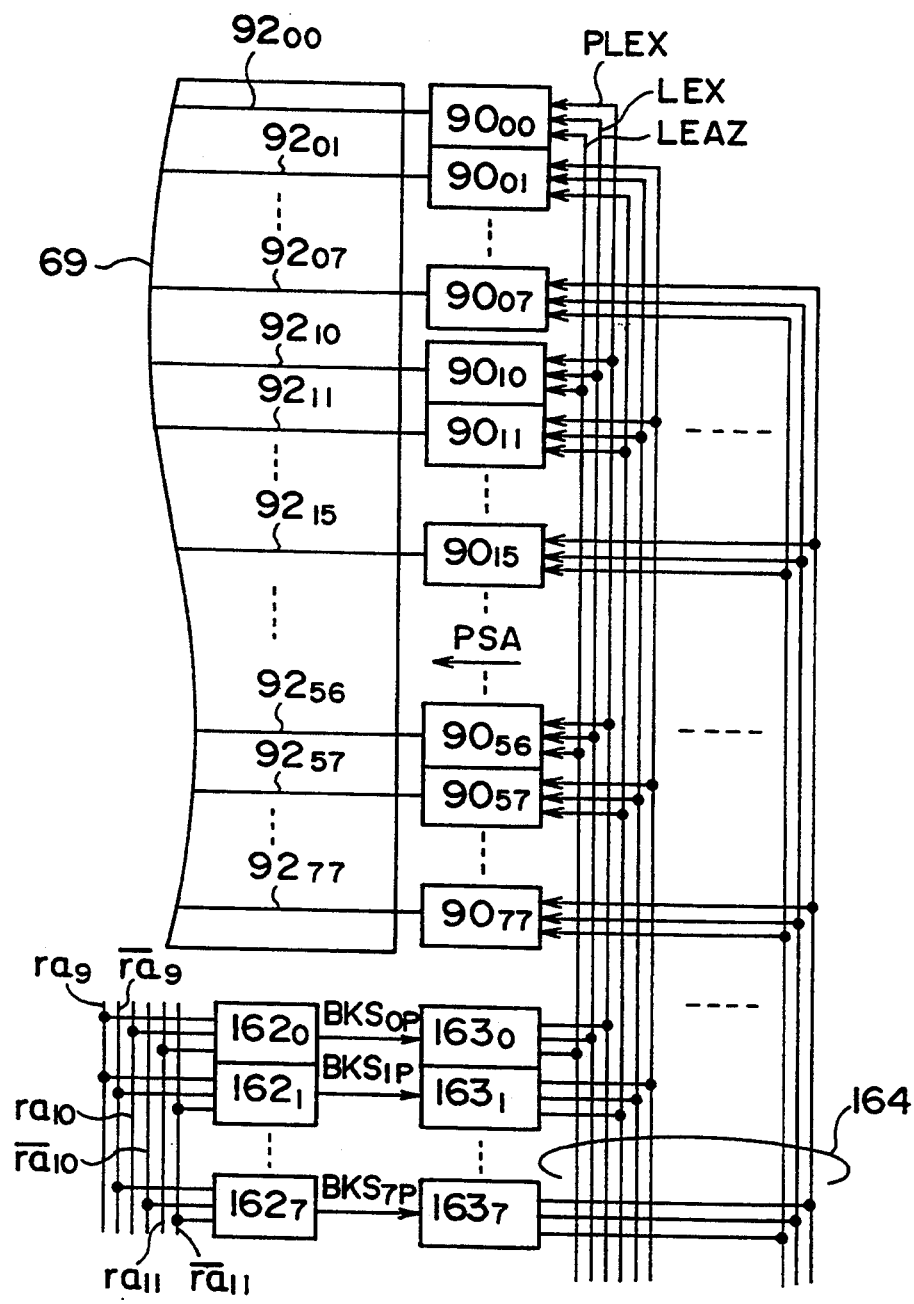

FIG. 11 shows the interconnection of the drivers $89_{00}$–$89_{77}$ for supplying thereto the foregoing signals LEAX, PLEZ and LEZ, wherein the interconnection is provided by a number of conductor strips collectively designated by a numeral 161. A similar interconnection 164 is provided also for the drivers $90_{00}$–$90_{77}$ as indicated in FIG. 12. As will be noted in FIGS. 11 and 12, the conductor patterns used for carrying the signals LEAX, PLEZ and LEX or signals LEAZ, PLEX and LEX occupies a substantial area on the chip, as these signals are supplied to the individual drivers via separate pattern sets each including three conductor strips in the illustrated example.

In order to select the appropriate set of conductor strips, there is provided a plurality of block selection circuits $159_0$–$159_7$ (FIG. 11) or $162_0$–$162_7$ (FIG. 12) connected to a complementary address bus for receiving a part of the complementary row address signals ra11, /ra11, ra10, /ra10, /ra9 and/ra9 for the upper three bits RA11, RA10 and RA9 of the row address data RA11–RA0. The block selection circuits $159_0$–$159_7$ cooperate with corresponding control circuits $160_0$–$160_7$ for activating one of the control circuit such as $160_0$ in response to the content of the address data on the address bus, by selectively supplying an appropriate one of the selection signals $BKS_{0N}$–$BKS_{7N}$. Similarly, the block selection circuits $162_0$–$162_7$ cooperate with corresponding control circuits $163_0$–$163_7$ in the construction of FIG. 12 for activating one of the control circuit such as $160_0$ in response to the content of the address data on the address bus, by selectively supplying an appropriate one of the selection signals $BKS_{0P}$–$BKS_{7P}$.

Next, a second embodiment of the present invention for eliminating the foregoing problem of a large area of the chip being occupied by the wiring will be described with reference to FIGS. 13 and 14.

Figure 13:
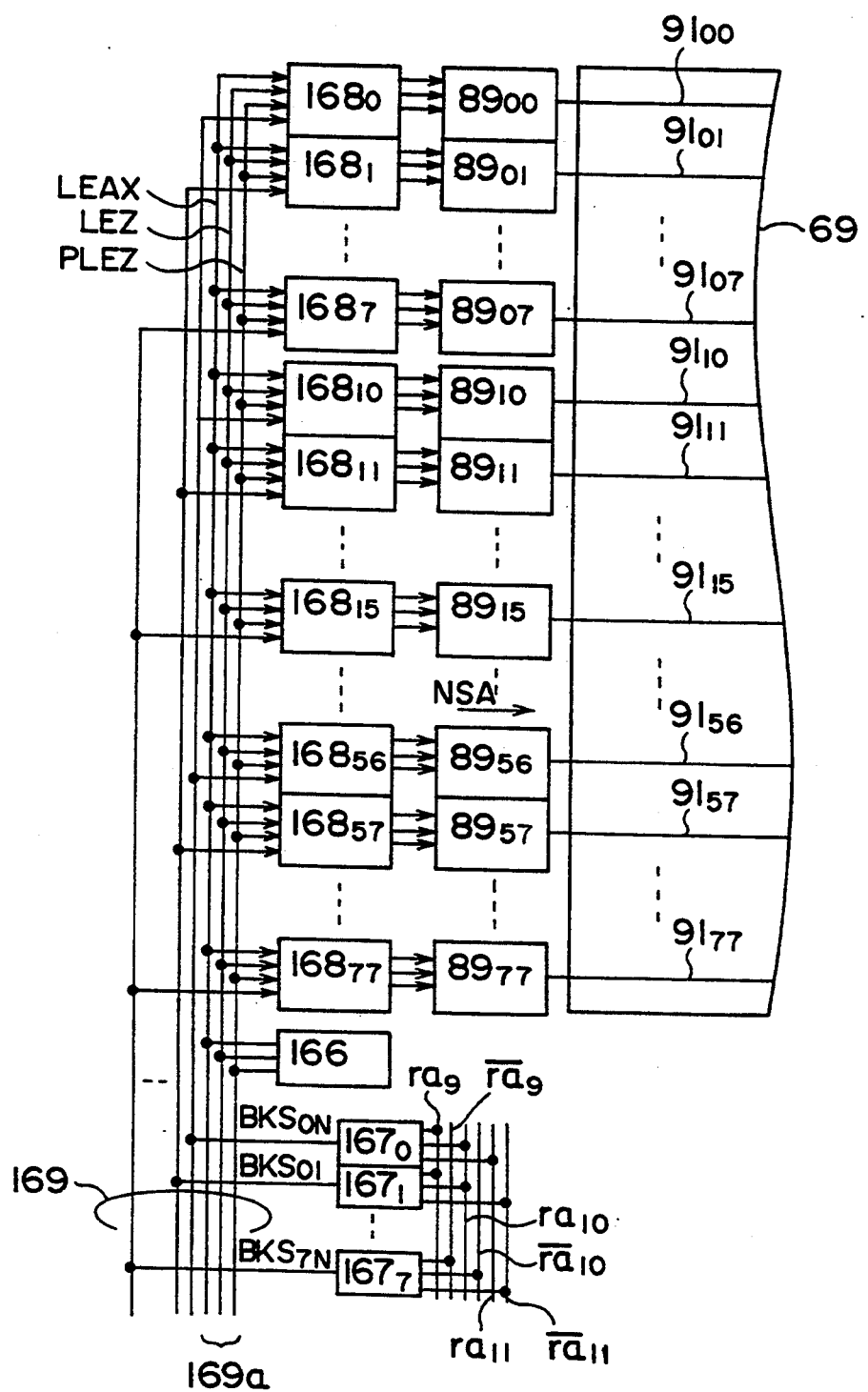
FIGS. 13 and 14 are diagrams showing the interconnection for selectively activating the sense amplifiers in a DRAM according to a second embodiment of the present invention.

Referring to FIG. 13, the circuit includes a single control circuit 166 corresponding to the control circuits of $160_0$–$160_7$ for producing the foregoing control signals LEAX, LEZ and PLEZ, wherein the signals LEAX, LEZ and PLEZ are supplied to the drivers $89_{00}$–$89_{77}$ via a common bus 169a forming a part of a bus 169, as well as to corresponding drivers of the memory cell arrays 70–72 (see FIG. 7). Further, there are provided block selection circuits $167_0$–$167_7$ connected to the address bus for receiving the complementary row address signals ra11, /ra11, ... ra9 and/ra9 that form the upper three bits RA11–RA9 of the row address data RA11–RA0. Each of the block selection circuits $167_0$–$167_7$ decodes the foregoing complementary address signals ra11, /ra11, ... ra9 and/ra9 and produces a block selection signal such as the signals $BKS_{0N}$–$BKS_{7N}$ for selecting a driver from the drivers $89_{00}$–$89_{77}$ by way of a gate circuit cooperating with the selected driver. It should be noted that gate circuits $168_0$–$168_{77}$ are provided in correspondence to the drivers $89_{00}$–$89_{77}$ for activating the same. The gate circuits $168_0$–$168_{77}$ thereby control the supply of the control signals LEAX, PLEZ and LEZ to the corresponding drivers $89_{00}$–$89_{77}$ in response to the block selection signals $BKS_{0N}$–$BKS_{7N}$ supplied thereto from the block selection circuits $167_0$–$167_7$.

In the embodiment of FIG. 13, it will be noted that the bus 169 includes eleven conductor strips in all, three of them being used for carrying the control signals LEAX, PLEZ and LEZ while the rest of the eight conductor strips carrying the block selection signals $BKS_{0N}$–$BKS_{7N}$.

Figure 14:
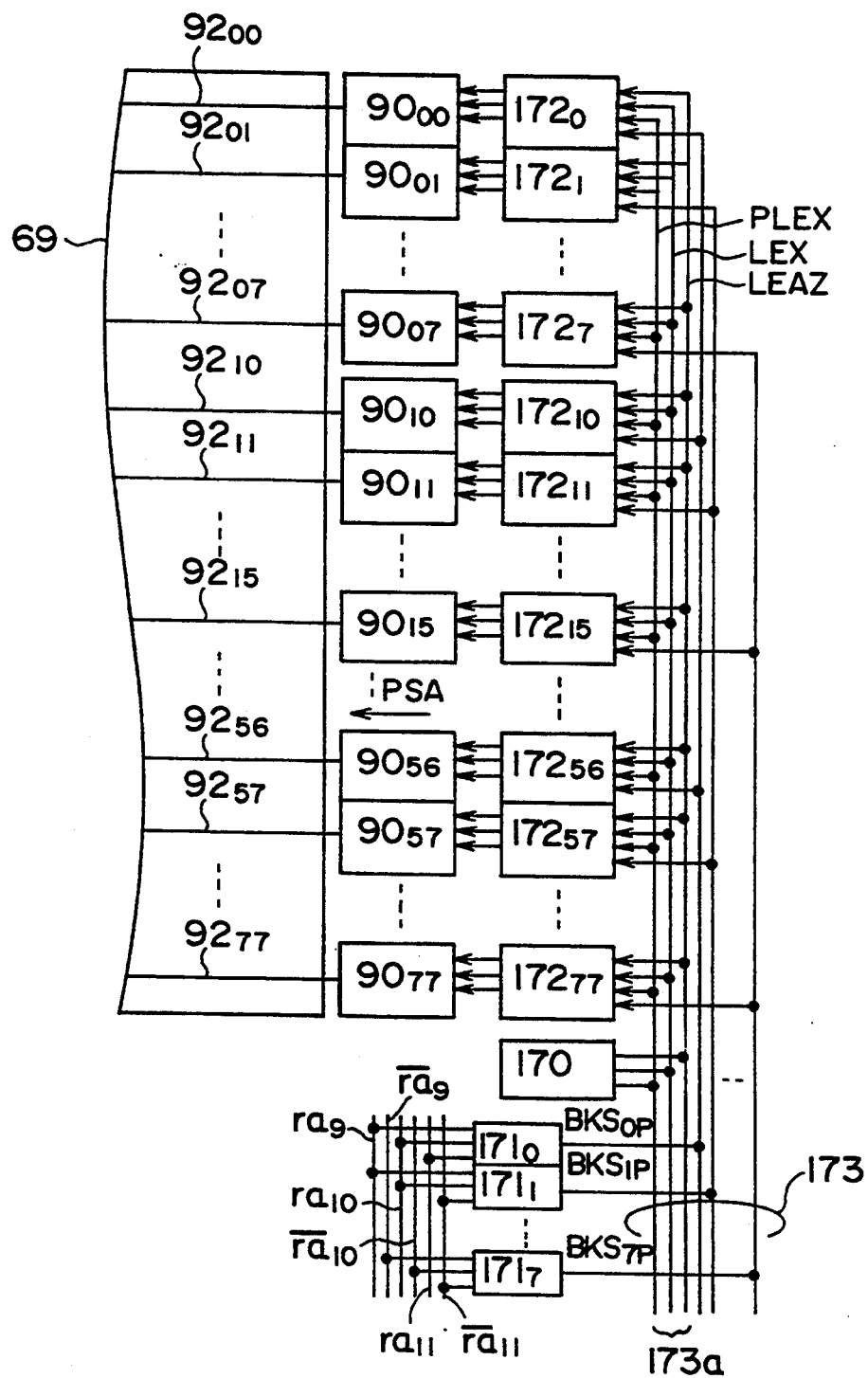

The construction of FIG. 14 is substantially identical with the construction of FIG. 13. Thus, the circuit of FIG. 14 includes a single control circuit 170 corresponding to the circuit 166 of FIG. 13 for producing the foregoing control signals LEAZ, LEX and PLEX, wherein the signals LEAZ, LEX and PLEX are supplied to the drivers $90_{00}$–$90_{77}$ via a common bus 173a forming a part of a bus 173, as well as to corresponding drivers of the memory cell arrays 70–72 (see FIG. 7). Further, there are provided block selection circuits $171_0$–$171_7$ connected to the address bus for receiving the complementary row address signals ra11, /ra11, ... ra9 and/ra9 that form the upper three bits RA11–RA9 of the row address data RA11–RA0. Each of the block selection circuits $171_0$–$171_7$ decodes the foregoing complementary address signals ra11, /ra11, ... ra9 and/ra9 and produces a block selection signal such as the signals $BKS_{0P}$–$BKS_{7P}$ for selecting a driver from the drivers $90_{00}$–$90_{77}$ by way of a gate circuit cooperating with the selected driver. It should be noted that gate circuits $172_0$–$172_{77}$ are provided in correspondence to the drivers $90_{00}$–$90_{77}$ for activating the same. The gate circuits $172_0$–$172_{77}$ thereby control the supply of the control signals LEAZ, PLEX and LEX to the corresponding drivers $90_{00}$–$90_{77}$ in response to the block selection signals $BKS_{0P}$–$BKS_{70}$ supplied thereto from the block selection circuits $171_0$–$171_7$.

In the embodiment of FIG. 14, too, it will be noted that the bus 173 includes eleven conductor strips in all, three of them being used for carrying the control signals LEAZ, PLEX and LEX while the rest of the eight conductor strips carrying the block selection signals $BKS_{0P}$–$BKS_{7P}$.

According to the construction of FIGS. 13 and 14, one can minimize the area on the chip that is occupied by the conductor strips forming the bus 169 or 173. As a result, one can secure a large area on the chip for carrying the memory cell array even when the construction of FIG. 8 for dividing the drive lines 87 and 88 are divided into a number of line segments for reduced parasitic resistance.

Figure 15:
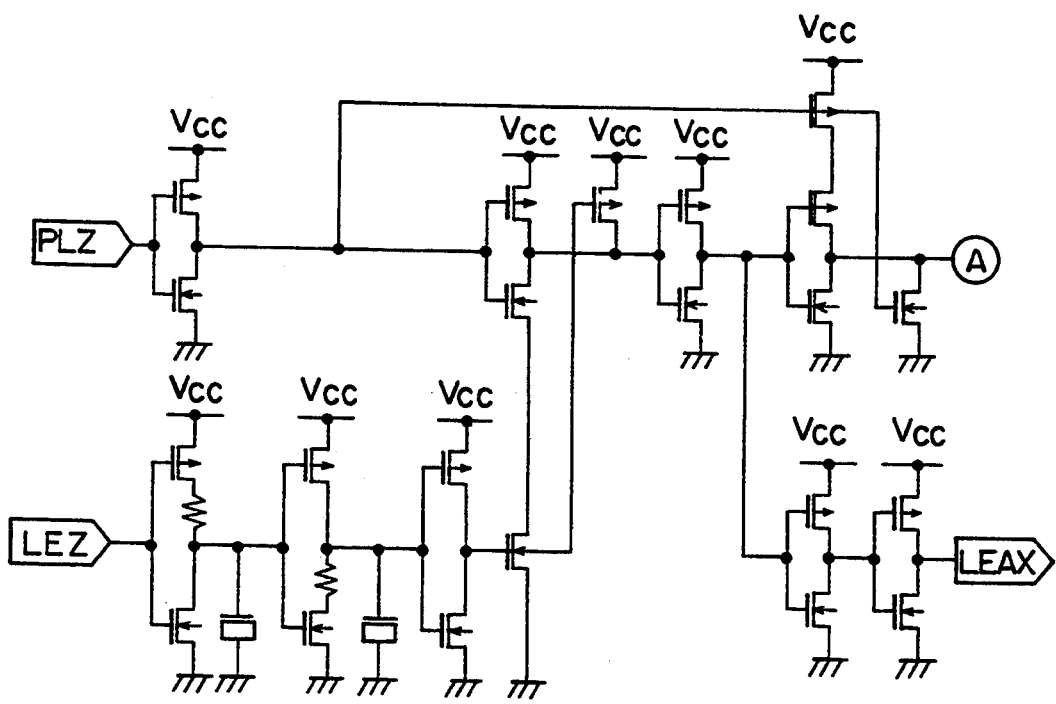
FIGS. 15 through 18 are circuit diagrams showing the construction of a control circuit used in the DRAM of FIGS. 13 and 14.
Figure 16:
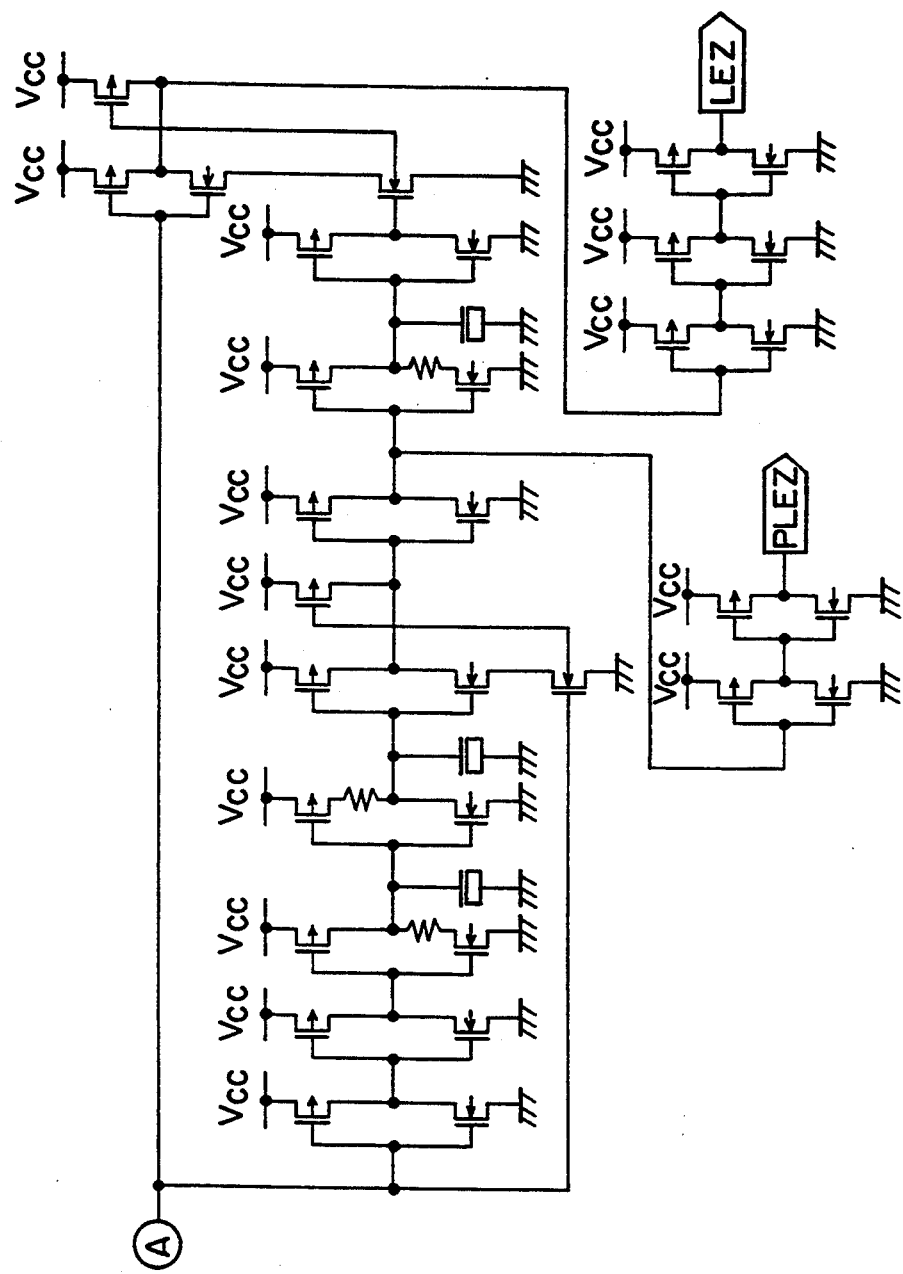

FIGS. 15 and 16 show the construction of the control circuit 166 for producing the control signals LEZ, PLEZ and LEAX, the drawings show different parts of the same circuit 166.

Referring to FIGS. 15 and 16, it will be noted that the control circuit 166 includes a number of cascaded inverters formed by a p-MOS transistor and an n-MOS transistor, and a master control signal PLZ for controlling the sense amplifier is supplied externally. The control signal PLZ activates the transition of the activation signal LEAX after a delay determined by the number of the inverters interposed between the input terminal to which the signal PLZ is supplied and the output terminal from which the activation signal LEAX is outputted. Further, the transition of the signal PLZ causes a transition of the pre-latch enable signal PLEZ after the transition of the activation signal LEAX for urging the level of the drive signal NSA to a low level state, followed by a transition of the latch enable signal LEZ. The latch enable signal LEZ is fed back to an input terminal for the signal LEZ shown in FIG. 15, and the signal LEZ causes a latching of the drive signal NSA at the low level state.

Figure 17:
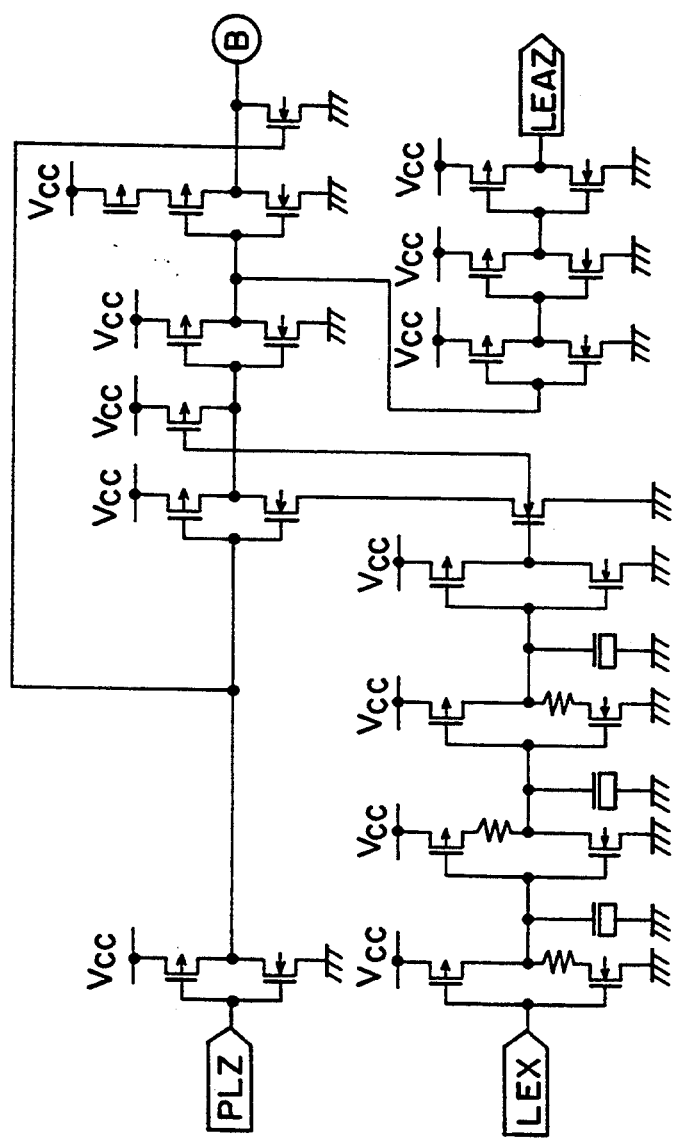
Figure 18:
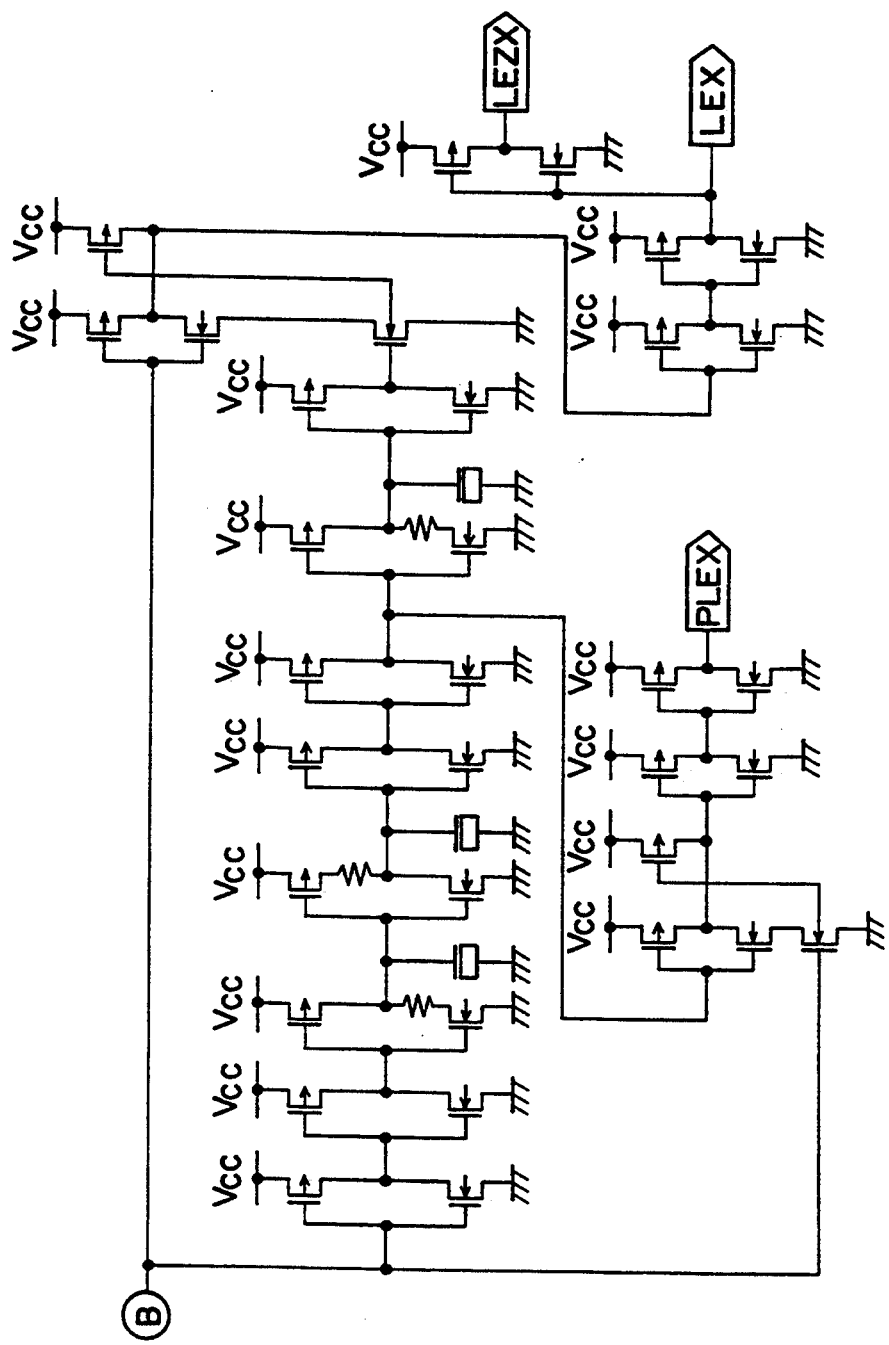

FIGS. 17 and 18 show the construction of the control circuit 170 of FIG. 14, wherein the control circuit 170 produces the activation signal LEAZ as well as the pre-latch enable signal PLEX and the latch enable signal LEX in response to the master control signal LEZ. Similarly to the circuit 166, the control signal LEZ causes a transition of the activation signal LEAZ for causing an activation of the drivers, followed by the transition of the pre-latch enable signal PLEX and the latch enable signal LEX, such that the drive signal PSA is urged to a high level state. The construction of FIGS. 15–18 is used conventionally in DRAMs.

Figure 19:
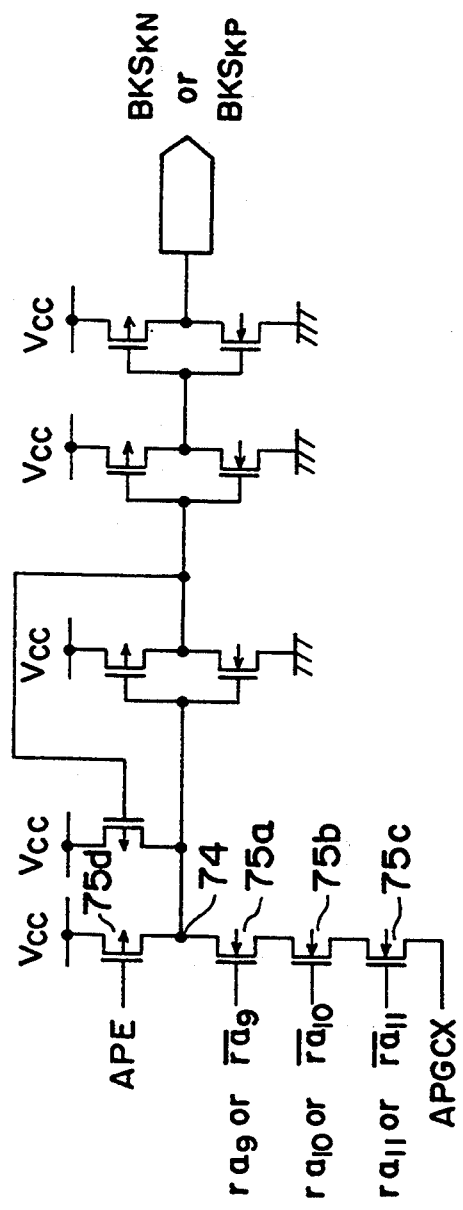
FIG. 19 is a circuit diagram showing the construction of a block selection circuit used in the DRAM of FIGS. 13 and 14.

FIG. 19 shows the construction of the block selection circuit 162 or 167. As the circuits 162 and 167 have essentially the same construction, only the description with regard to the circuit 162 will be given below.

Referring to FIG. 19, the circuit 162 includes n-MOS transistors 75a–75c connected in series to form an AND gate between a supply voltage source Vcc and a ground line APGCX for selecting a specific logic combination of the signals $ra_{11}$, $/ra_{11}$, ..., $ra_9$ and $/ra_9$, wherein the AND gate is supplied with a precharge voltage at a node 74 via a p-MOS transistor 75d that is turned on in response to an enable signal APE. It should be noted that the ground line APGCX is connected to the ground via a ground control circuit not illustrated. The voltage obtained at the node 74 is then supplied to an output terminal via inverters, wherein the output terminal outputs the voltage as the block selection signal BKSKN.

Figure 20:
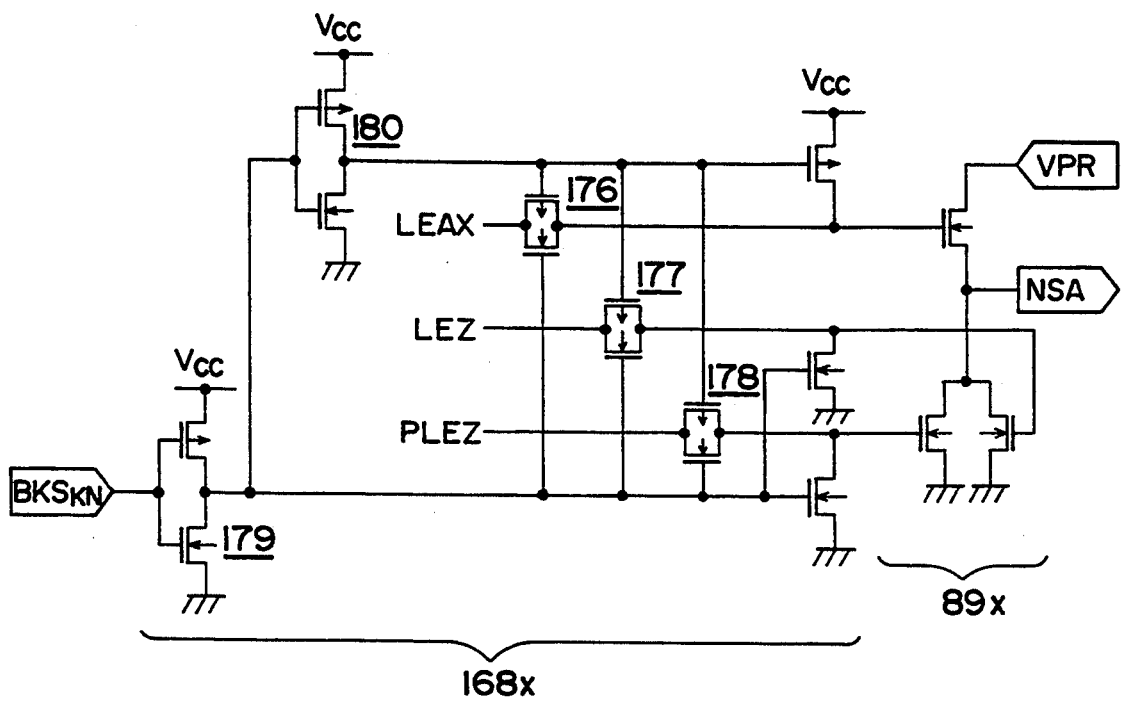
FIGS. 20-23 are circuit diagrams showing the construction of a gate circuit used in the DRAM of FIG. 13 and 14.

FIG. 20 shows the construction of a gate circuit $168_x$ that collectively designates the gate circuits $168_0$–$168_{77}$, together with the construction of the driver designated as $89_x$. It should be noted that the driver $89_x$ corresponds to the driver of FIG. 9.

Referring to FIG. 20, the gate circuit $16_x$ includes switches 176–178 for respectively transferring the control signals LEAX, LEZ and PLEZ in response to the block selection signal $BKS_{KN}$, wherein it will be noted that the signal $BKS_{KN}$ is received by an inverter 179 and is supplied further to a first control terminal of the switches 176–178 via an inverter 180 as well as to a second control terminal of the switches 176–178. It should be noted that the each of the switches 176–178 includes a p-MOS transistor and an n-MOS transistor connected parallel with each other, wherein the foregoing first terminal is given by the gate of the p-MOS transistor while the second terminal is given by the gate of the n-MOS transistor. Thus, the switches 176–178 respectively pass the signals LEAX, LEZ and PLEZ therethrough in response to the block selection signal $BKS_{KN}$. The signal LEAX urges, after passing through the switch circuit 176, the level of the trunk NSA to the level of the precharge voltage VPR. On the other hand, the signals LEZ and PLEZ urges the level of the trunk NSA to the low level state when passed through the respective switch circuits 177 and 178 in response to the selection signal $BKS_{KN}$.

Figure 21:
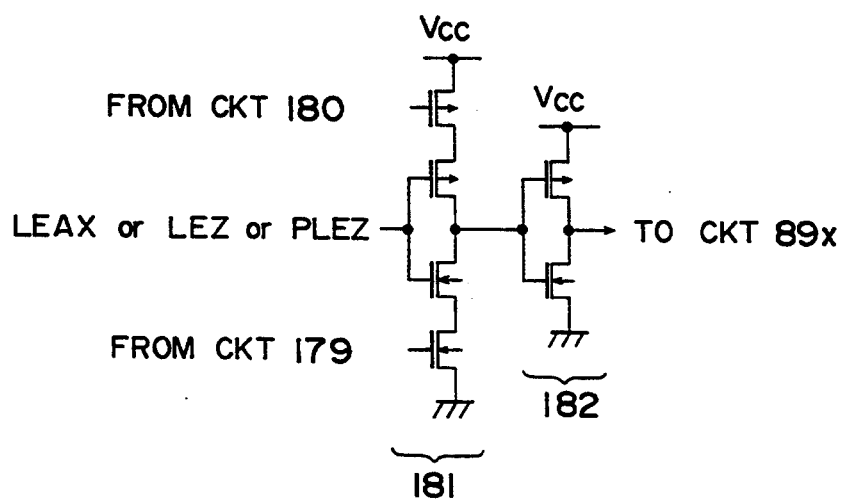

FIG. 21 shows an alternative construction of the switches 176–178, wherein the switch of FIG. 21 includes a digital switch circuit 181 including p-MOS transistors and n-MOS transistors connected in series. The control signal such as LEAX, LEZ or PLEZ is supplied to an inverter part of the circuit 181 formed by a p-MOS transistor and an n-MOS transistor connected in series, and the output of the inverter circuit 180 of FIG. 20 is supplied to the gate of a p-MOS transistor connected to the foregoing inverter part for supplying the supply voltage Vcc. Further, the output of the inverter circuit 179 is supplied to the gate of the n-MOS transistor connected in series to the foregoing inverter part for connecting the inverter part to the ground level. Thereby, the output of the inverter part is supplied to the driver 89x via the inverter 182 as indicated in FIG. 21.

Figure 22:
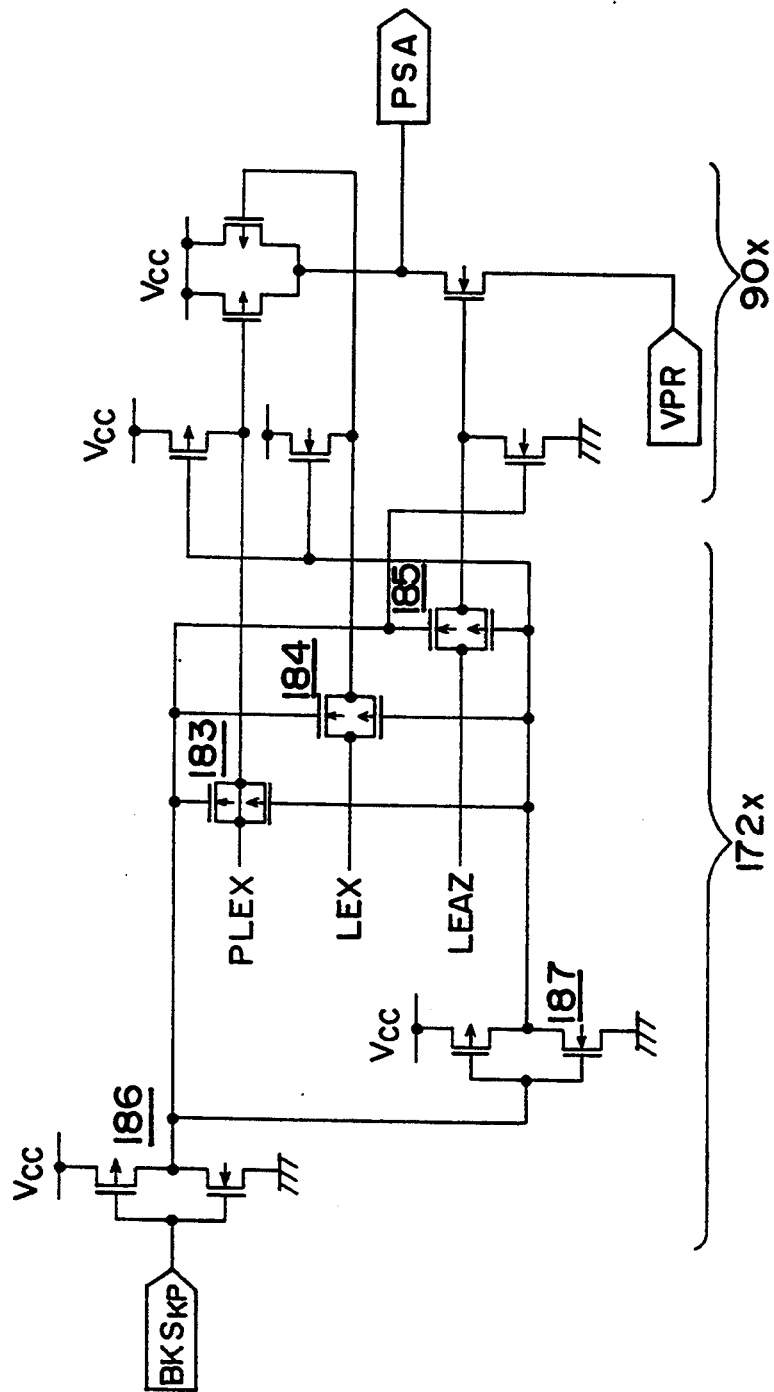

FIG. 22 shows the construction of a gate circuit $172_x$ that collectively designates the gate circuits $172_0$–$172_{77}$, together with the construction of the driver designated as $90_x$. It should be noted that the driver $90x$ corresponds to the driver of FIG. 10.

In the gate circuit $172_x$, too, it should be noted that the supply of the control signals PLEX, LEX and LEAZ is controlled by switches 183–185 having a construction similar to the switches 176–178. Thus, upon the supply of the block selection signal $BKS_{KP}$, the control signals PLEX, LEX and LEAZ are forwarded to the driver 90x and the level of the drive signal PSA is urged to the precharge voltage level VPR in response to the signal LEAZ and to the voltage level Vcc in response to the control signals PLEX and LEX. Thereby, the desired activation of the trunk is achieved. As the construction of the switches 183–185 is substantially identical with the construction of the switches 176–178, further description will be omitted.

Figure 23:
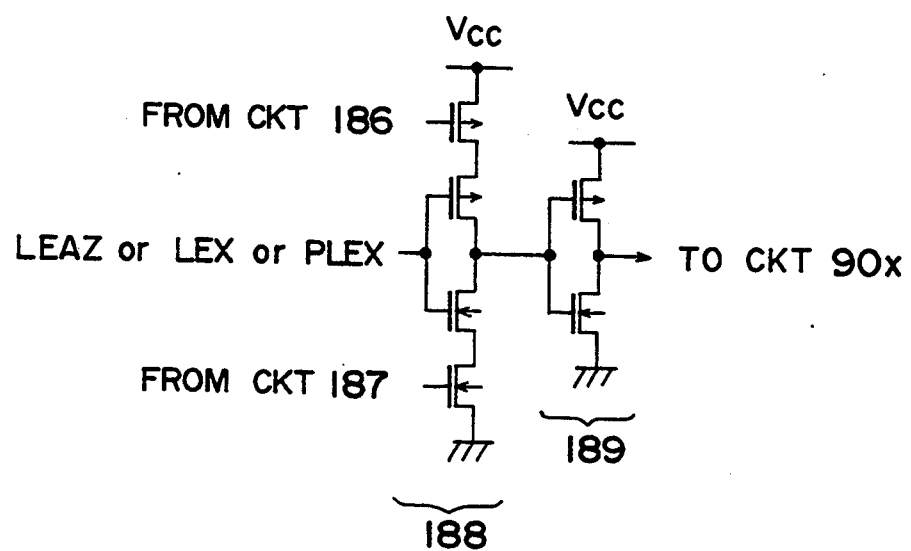

FIG. 23 shows a modification of the switches 183–185 of FIG. 22 and corresponds to the circuit of FIG. 21. Thus, the circuit of FIG. 23 includes a digital switch circuit 188 and an inverter 189 similarly to the circuit of FIG. 21. In the modification of FIG. 23, too, the block selection signal BKSKp is supplied, via an inverter 186 of FIG. 22, to a p-MOS transistor forming a part of the switch circuit 188, wherein the supply voltage Vcc is supplied to an inverter part formed in the circuit 188 upon turning-on of the p-MOS transistor. Further, the block selection signal $BKS_{KP}$ is supplied from the foregoing inverter 186 of FIG. 22 to another inverter 187 also shown in FIG. 22, and the output of the inverter 187 turns on an n-MOS transistor connected between the foregoing inverter part of the digital switch circuit 188 and the ground. Thereby, the control signal such as LEAZ, LEX or PLEX supplied to the input of the inverter part of the circuit 188 is forwarded to the driver 90x after passing through the inverter 189.

Figure 24:
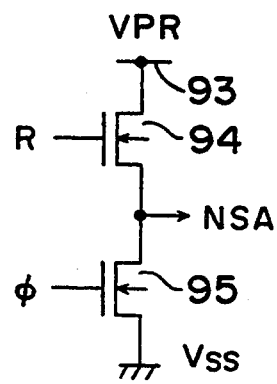
FIGS. 24 and 25 are circuit diagrams showing alternative examples of the drivers used in the DRAM of the present invention.
Figure 25:
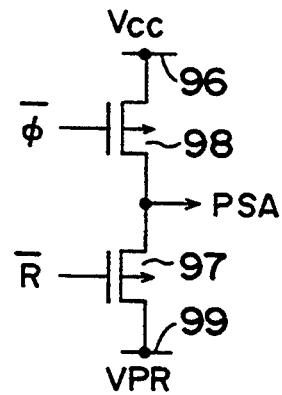

FIGS. 24 and 25 show another example of the driver circuits 89 and 90, wherein the driver circuit 89 of FIG. 24 includes two n-MOS transistors 94 and 95 connected in series between a supply voltage terminal 93 and the ground set at the voltage level Vss, wherein the transistor 94 is turned on in response to a control signal R while the transistor 95 is turned on in response to a control signal $\phi$. In response to the turning-on of the transistor 94, the drive signal NSA is urged to the precharge level VPR, while when the transistor 95 is turned on, the drive signal NSA is urged to the ground level.

Similarly, the drive circuit 90 includes two p-MOS transistors 97 and 98 connected in series between a supply voltage terminal 96 set at the voltage level Vcc and a terminal 99 set at the precharge voltage level VPR, wherein the transistor 98 is turned on in response to the control signal $\phi$ and urges the level of the drive signal PSA to the voltage Vcc in response thereto, while the transistor 97 is turned on in response to the control signal /R and urges the signal PSA to the level VPR.

In the present embodiment corresponding to the construction of FIGS. 13 and 14, one should note that the control circuit 166 or 170 having a large scale construction as shown in FIGS. 15-18, is provided only one at each side of the memory cell array. Whereas one has to provide a large number of the gate circuits 168 or 172 in correspondence to the drivers 89 or 90 in order to achieve the selection of the drivers, each gate circuit has a relatively simple circuit construction as shown in FIG. 20 or FIG. 22. Thus, the embodiment of FIGS. 13 and 14 is particularly advantageous for minimizing the area on the chip occupied by the circuits or conductor patterns. When the drivers of FIGS. 24 and 25 are used in the embodiment of FIGS. 13 and 14, one needs only two control signals for controlling the drivers, and the area that is occupied by the conductor patterns forming the bus 169a or 173a is further reduced.

In the example of FIGS. 13 and 14, it should be noted that one needs only eleven conductor strips (three strips for carrying the control signals (LEAX, LEZ and PLEZ or LEAZ, LEX and PLEX) and eight strips for selecting a driver (89$_{00}$–89$_{07}$, 90$_{00}$–90$_{07}$, . . . ) for the bus 169 or 173 at each side of the memory cell arrays 69–72 that are aligned vertically on the chip as indicated in FIG. 7. Thereby, one needs twenty two lines at both sides of the memory cell arrays 6–72 for the buses 169 and 173. Even when the memory cell arrays 73–76 are taken into consideration, the number of the necessary conductors is only forty four. This number of the conductor strips is significantly smaller than the conductor strips needed in the embodiment of FIGS. 11 and 12. In the embodiment of FIGS. 11 and 12, it should be noted that one needs ninety six strips in all for the memory cell arrays 69–72 and 73–76, in which forty eight strips (48=3×8×2) are for the memory cell arrays 69–72 and the other forty eight strips for the memory cell arrays 73–76.

Thus, the present embodiment described with reference to FIGS. 13 and 14 provides a significant improvement over the embodiment of FIGS. 11 and 12. The present invention is particularly useful for DRAMs exceeding the storage capacity of 64 Mbits such as the one having a storage capacity of 256 Mbits. However, the construction of the present invention is by no means limited to DRAMs but is applicable to any semiconductor memory devices such as SRAMs or flash memories that use sense amplifiers for detecting the content of the information.

Further, the present invention is not limited to the embodiments described heretofore, but various variations and modifications may be made without departing from the scope of the invention.

What is claimed is:

1. A semiconductor memory device, comprising:
   a memory cell array provided on a semiconductor chip and including a plurality of memory cells aligned in rows and columns, each of said memory cells storing therein information, said memory cell array being defined by a boundary including first and second, mutually opposing edges each extending in a column direction;
   a plurality of sense amplifier columns provided on said memory cell array, each of said plurality of sense amplifier columns including a plurality of sense amplifiers aligned in said column direction;
   a plurality of drive line pairs provided on said memory cell array in correspondence to said plurality of sense amplifier columns, each of said drive line pairs including first and second drive lines extending in said column direction, each of said drive line pairs supplying an electric power to a plurality of sense amplifiers included in a corresponding sense amplifier column;
   a first driver circuit provided on said semiconductor chip at a location outside said memory cell array for producing a first drive current;
   a second driver circuit provided on said semiconductor chip at a location outside said memory cell array for producing a second drive current;
   a first trunk pattern extending from said first driver for carrying said first drive current, said first trunk pattern extending in a row direction over said memory cell array from said first edge toward said second edge across a plurality of sense amplifier columns and connected to first drive lines in said plurality of drive line pairs corresponding to said plurality of sense amplifier columns that said first trunk pattern has crossed;
   a second trunk pattern extending from said second driver for carrying said second drive current, said second trunk pattern extending in a row direction over said memory cell array from said second edge toward said first edge across a plurality of sense amplifier columns and connected to second drive lines in said plurality of drive line pairs corresponding to said plurality of sense amplifier columns that said second trunk pattern has crossed;
   said first trunk pattern having a width that decreases from said first edge of said memory cell array toward said second edge, such that said first trunk has a first width at said first edge and a second, smaller width at a free end of said first trunk pattern;
   said second trunk pattern having a width that decreases from second first edge of said memory cell array toward said first edge, such that said second trunk has a width substantially equal to said first width at said second edge and a smaller width substantially equal to said second width at a free end of said second trunk pattern;

said first and second trunk patterns being so disposed that said first and second trunk patterns extend over said memory cell array in correspondence to a hypothetical strip-like area extending from said first edge to said second edge of said memory cell array with a constant width substantially equal to said first width.

2. A semiconductor memory device as claimed in claim 1, wherein said width of said first trunk pattern decreases stepwise upon connection to a first drive line, and wherein said width of said second trunk pattern decreases stepwise upon connection to a second drive line.

3. A semiconductor memory device as claimed in claim 1, wherein said first trunk pattern is connected to two first drive lines, said second trunk pattern is connected to two second drive lines, said width of said first trunk pattern decreases stepwise from a first width to a second, smaller width, upon connection of said first trunk pattern to one of said first drive lines located close to said first edge of said memory cell array, said width of said second trunk pattern decreases stepwise from a third width substantially equal to said first width to a fourth width substantially equal to said second width, upon connection of said second trunk pattern to one of said second drive lines located close to said second edge of said memory cell array.

4. A semiconductor memory device as claimed in claim 3, wherein said first trunk pattern forms a first distal end part extending toward said second edge of said memory cell array beyond said first drive line that is located close to said first edge of said memory cell array and to which said first trunk pattern is connected, with said second width, said first distal end part being connected to the other of said two first drive lines located close to said second edge of said memory cell array, and wherein said second trunk pattern forms a second distal end part extending toward said first edge of said memory cell array beyond said second drive line that is located close to said second edge of said memory cell array and to which said second trunk pattern is connected, with said fourth width, said second distal end part being connected to the other of said two second drive lines located close to said first edge of said memory cell array.

5. A semiconductor memory device, comprising:
a memory cell array provided on a semiconductor chip and including a plurality of memory cells aligned in rows and columns, each of said memory cells storing therein information, said memory cell array being defined by a boundary including first and second, mutually opposing edges each extending in a column direction;
a plurality of sense amplifier columns provided on said memory cell array, each of said plurality of sense amplifier columns including a plurality of sense amplifiers aligned in said column direction;
a plurality of drive line pairs provided on said memory cell array in correspondence to said plurality of sense amplifier columns, each of said drive line pairs including first and second drive lines extending in said column direction, each of said drive line pairs supplying an electric power to a plurality of sense amplifiers included in a corresponding sense amplifier column;

a plurality of first driver circuits provided on said semiconductor chip at a location outside said memory cell array for producing a first drive current,
a plurality of second driver circuit provided on said semiconductor chip at a location outside said memory cell array for producing a second drive current;
a plurality of first trunk patterns provided in correspondence to said plurality of first driver circuits, each of said plurality of first trunk patterns extending from a corresponding first driver for carrying said first drive current, each of said first trunk patterns extending in a row direction over said memory cell array from said first edge toward said second edge across a plurality of sense amplifier columns and connected to first drive lines in said plurality of drive line pairs corresponding to said plurality of sense amplifier columns that said first trunk pattern has crossed;
a plurality of second trunk patterns provided in correspondence to said plurality of second driver circuits and in correspondence to said plurality of first trunk patterns, each of said plurality of second trunk patterns extending from a corresponding second driver for carrying said second drive current, each of said second trunk patterns extending in a row direction over said memory cell array from said second edge toward said first edge across a plurality of sense amplifier columns and connected to second drive lines in said plurality of drive line pairs corresponding to said plurality of sense amplifier columns that said second trunk pattern has crossed;
each of said first trunk patterns having a width that decreases from said first edge of said memory cell array toward said second edge, such that said first trunk has a first width at said first edge and a second, smaller width at a free end of said first trunk pattern;
each of said second trunk patterns having a width that decreases from second first edge of said memory cell array toward said first edge, such that said second trunk has a width substantially equal to said first width at said second edge and a smaller width substantially equal to said second width at a free end of said second trunk pattern;
each of said first and second, mutually corresponding trunk patterns being so disposed that said first and second trunk patterns extend over said memory cell array in correspondence to a hypothetical strip-like area extending from said first edge to said second edge of said memory cell array with a constant width substantially equal to said first width.

6. A semiconductor memory device as claimed in claim 5, wherein a plurality of said first trunks are connected to a single first drive line and wherein a plurality of said second trunks are connected to a single second drive line.

7. A semiconductor memory device, comprising:
a memory cell array including a plurality of memory cells aligned in rows and columns;
a plurality of sense amplifier columns provided on said memory cell array, each of said plurality of sense amplifier columns including a plurality of sense amplifiers aligned in said column direction;
a plurality of drive line pairs provided on said memory cell array in correspondence to said plurality of sense amplifier columns, each of said drive line pairs including first and second drive lines extending in said column direction;

a first driver circuit provided at a one side of said memory cell array for producing a first drive current;

a second driver circuit provided at another side of said memory cell array for producing a second drive current;

a first trunk pattern extending from said first driver in a row direction over said memory cell array from said one side toward said the other side and connected to first drive lines;

a second trunk pattern extending from said second driver in a row direction over said memory cell array from said the other side toward said one side and connected to second drive lines;

said first and second trunk patterns being so disposed that said first and second trunk patterns extend over said memory cell array in correspondence to a hypothetical strip-like area extending from said first edge to said second edge of said memory cell array;

said first trunk pattern being connected to respective first drive lines included in two drive line pairs located adjacent with each other;

said second trunk pattern being connected to respective second drive lines included in two drive line pairs located adjacent with each other.

* * * * *